United States Patent
Lee et al.

(10) Patent No.: US 9,847,346 B2
(45) Date of Patent: Dec. 19, 2017

(54) THREE-DIMENSIONAL SEMICONDUCTOR MEMORY DEVICE

(71) Applicant: Samsung Electronics Co., Ltd., Suwon-si, Gyeonggi-do (KR)

(72) Inventors: Changhyun Lee, Suwon-si (KR); Heonkyu Lee, Hwaseong-si (KR); Shinhwan Kang, Seoul (KR); Youngwoo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/259,941

(22) Filed: Sep. 8, 2016

(65) Prior Publication Data

US 2017/0084696 A1    Mar. 23, 2017

(30) Foreign Application Priority Data

Sep. 18, 2015  (KR) .................. 10-2015-0132517

(51) Int. Cl.
| | | |
|---|---|---|
| *H01L 29/49* | (2006.01) | |
| *H01L 27/11582* | (2017.01) | |
| *H01L 27/11565* | (2017.01) | |
| *H01L 27/11556* | (2017.01) | |
| *H01L 27/11519* | (2017.01) | |

(52) U.S. Cl.
CPC .. *H01L 27/11582* (2013.01); *H01L 27/11565* (2013.01); *H01L 27/11519* (2013.01); *H01L 27/11556* (2013.01)

(58) Field of Classification Search
CPC ........... H01L 27/1182; H01L 27/11565; H01L 27/11519; H01L 27/11556
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,569,827 B2 | 10/2013 | Lee et al. |
| 8,654,587 B2 | 2/2014 | Yoon et al. |
| 8,872,183 B2 | 10/2014 | Chang et al. |
| 9,012,974 B2 | 4/2015 | Chae et al. |
| 9,048,138 B2 | 6/2015 | Moon et al. |
| 2011/0233648 A1 | 9/2011 | Seol et al. |
| 2014/0054675 A1 | 2/2014 | Lee et al. |
| 2014/0264548 A1 | 9/2014 | Lee et al. |
| 2015/0145015 A1 | 5/2015 | Shin et al. |
| 2015/0155296 A1 | 6/2015 | Yoon |

(Continued)

FOREIGN PATENT DOCUMENTS

| | | |
|---|---|---|
| KR | 10-1014854 B1 | 2/2011 |
| KR | 10-2014-0093106 A | 7/2014 |

*Primary Examiner* — Michael Shingleton

(74) *Attorney, Agent, or Firm* — Myers Bigel, P.A.

(57) ABSTRACT

A three-dimensional semiconductor memory device includes a stack on a substrate including electrodes vertically stacked on a substrate, lower insulating patterns disposed between the stack and the substrate, the lower insulating patterns being adjacent to both sidewalls of the stack and being spaced apart from each other, a plurality of vertical structures penetrating the stack and being connected to the substrate, and a data storing pattern between the stack and the vertical structures, the data storing pattern including a portion disposed between the lowermost one of the electrodes and the substrate.

20 Claims, 27 Drawing Sheets

(56) References Cited

U.S. PATENT DOCUMENTS

| | | | |
|---|---|---|---|
| 2016/0155750 A1* | 6/2016 | Yasuda | H01L 27/11582 |
| | | | 257/324 |
| 2016/0260734 A1* | 9/2016 | Beppu | H01L 27/1157 |
| 2016/0260736 A1* | 9/2016 | Fujii | H01L 27/11582 |
| 2016/0268283 A1* | 9/2016 | Kitamura | H01L 21/28282 |
| 2016/0372481 A1* | 12/2016 | Izumida | H01L 27/11582 |
| 2017/0084696 A1* | 3/2017 | Lee | H01L 27/11565 |
| 2017/0148814 A1* | 5/2017 | Rhie | H01L 27/11582 |
| 2017/0148815 A1* | 5/2017 | Fukuzumi | H01L 27/11582 |

* cited by examiner

THREE-DIMENSIONAL SEMICONDUCTOR MEMORY DEVICE

CROSS-REFERENCE TO RELATED APPLICATIONS

This U.S. non-provisional patent application claims priority under 35 U.S.C. §119 to Korean Patent Application No. 10-2015-0132517, filed on Sep. 18, 2015, in the Korean Intellectual Property Office, the entire contents of which are hereby incorporated by reference.

BACKGROUND OF THE INVENTION

The present disclosure relates to a three-dimensional semiconductor memory devices, and in particular, to a three-dimensional semiconductor memory devices with high reliability and high density.

Higher integration of semiconductor devices may be required to satisfy consumer demands for superior performance and inexpensive prices. In the case of semiconductor devices, since integration is a factor in determining product prices, increased integration may be especially desired. In the case of typical two-dimensional or planar semiconductor devices, since integration may be determined by the area occupied by a unit memory cell, integration may be influenced by the level of a fine pattern forming technology. However, expensive process equipment may be used to increase pattern fineness, which may set practical limitations on increasing integration for two-dimensional or planar semiconductor devices. To address such limitations, three-dimensional semiconductor memory devices, including three-dimensionally arranged memory cells, have been developed.

SUMMARY

Some embodiments of the inventive concepts provide a three-dimensional semiconductor memory device with high reliability and high density.

According to some embodiments of the inventive concepts, a three-dimensional semiconductor memory device includes a substrate, an electrode stack including insulating patterns and conductive electrode patterns alternatingly stacked on a surface of the substrate, vertical channel structures extending through the electrode stack to contact the substrate, lower insulating patterns between the electrode stack and the surface of the substrate at opposite sides of the electrode stack to define respective recesses adjacent sidewalls of the vertical channel structures, and data storing patterns continuously extending from between the sidewalls of the vertical channel structures and the electrode stack to the surface of the substrate and into the respective recesses to contact sidewalls of the lower insulating patterns.

In some embodiments, the data storing patterns may respectively include vertical portions extending between the sidewalls of the vertical channel structures and the electrode stack, first lateral portions extending into the respective recesses to contact the sidewalls of the lower insulating patterns, and second lateral portions extending along the surface of the substrate to contact adjacent ones of the vertical channel structures.

In some embodiments, a thickness of the lower insulating patterns may be greater than that of the data storing patterns and smaller than that of the conductive electrode patterns, and the first lateral portions of the data storing patterns in the respective recesses may have a thickness of about twice that of the vertical portions.

In some embodiments, a first protection insulating pattern may extend between the first and second lateral portions of the data storing patterns and the surface of the substrate to provide electrical insulation therefrom, and a second protection insulating pattern may extend between the first and second lateral portions of the data storing patterns and the electrode stack. The first and second protection insulating patterns may be formed of an insulating material different from the lower insulating patterns.

In some embodiments, the vertical channel structures may respectively include a first semiconductor pattern extending along the data storing patterns on sidewalls of the electrode stack, and a second semiconductor pattern extending along the sidewalls of the electrode stack with the first semiconductor pattern therebetween. The first semiconductor pattern and the data storing patterns may be confined above the surface of the substrate, while the second semiconductor pattern may extend beyond the data storing patterns to directly contact the substrate below the surface thereof.

In some embodiments, the vertical channel structures and/or the second semiconductor pattern thereof may be free of epitaxial semiconductor layers.

In some embodiments, the second semiconductor pattern may laterally extend along the surface of the substrate to contact the laterally extending portion of the data storing pattern and to contact a bottom surface of the first semiconductor pattern.

According to some embodiments of the inventive concepts, a three-dimensional (3D) semiconductor memory device may include a stack including electrodes vertically stacked on a substrate, lower insulating patterns interposed between the stack and the substrate, the lower insulating patterns being adjacent to both sidewalls of the stack and being horizontally or laterally spaced apart from each other, a plurality of vertical structures penetrating the stack and being connected to the substrate, and a data storing pattern between the stack and the vertical structures, the data storing pattern including a portion disposed between the lowermost one of the electrodes and the substrate.

According to some embodiments of the inventive concepts, a three-dimensional (3D) semiconductor memory device may include a pair of lower insulating patterns on a substrate to be spaced apart from each other and extend in a first direction, a stack on the pair of lower insulating patterns, the stack including electrodes vertically stacked on the substrate and extending in the first direction, a plurality of vertical structures penetrating the stack and being connected to the substrate, and a data storing pattern enclosing sidewalls of the vertical structures. The data storing pattern may extend to face a bottom surface of the lowermost one of the electrodes and to contact the lower insulating patterns.

According to some embodiments of the inventive concepts, a method of fabricating a three-dimensional semiconductor memory device may include forming a first sacrificial layer on a substrate, forming a layered structure, in which second sacrificial layers and interlayered insulating layers are alternatingly stacked, on the first sacrificial layer, forming a vertical structure to pass through the layered structure and the first sacrificial layer and be connected to the substrate, patterning the layered structure to form a plurality of mold structures and expose a portion of the first sacrificial layer between the mold structures, replacing the first sacrificial layer with a lower insulating pattern, and replacing the second sacrificial layers of the mold structures with electrodes.

In some embodiments, before the formation of the vertical structure, a data storing pattern may be further formed between the stack and the vertical structures and between the layered structure and the substrate. The data storing pattern may be formed to contact the first sacrificial layer.

In some embodiments, the formation of the vertical structures may include forming a first semiconductor pattern to extend on or cover a sidewall of the data storing pattern and forming a second semiconductor pattern to connect the first semiconductor pattern to the substrate. The second semiconductor pattern may be formed to include a portion interposed between the first semiconductor pattern and the substrate, and a portion of the sidewall of the second semiconductor pattern may be in contact with the data storing pattern.

In some embodiments, the formation of the data storing pattern may include forming a plurality of vertical holes penetrating the layered structure and exposing portions of the first sacrificial layer, removing the exposed portion of the first sacrificial layer to form a first recess region between the layered structure and the substrate, forming a data storing layer to conformally extend on or cover inner surfaces of the vertical holes and the first recess region, and removing a portion of the data storing layer below the vertical holes to form a penetration hole exposing the substrate.

In some embodiments, the replacing of the first sacrificial layer with the lower insulating pattern may include removing a portion of the first sacrificial layer exposed between the mold structures to form a second recess region partially exposing the data storing pattern between the layered structure and the substrate and filling the second recess region with a lower insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
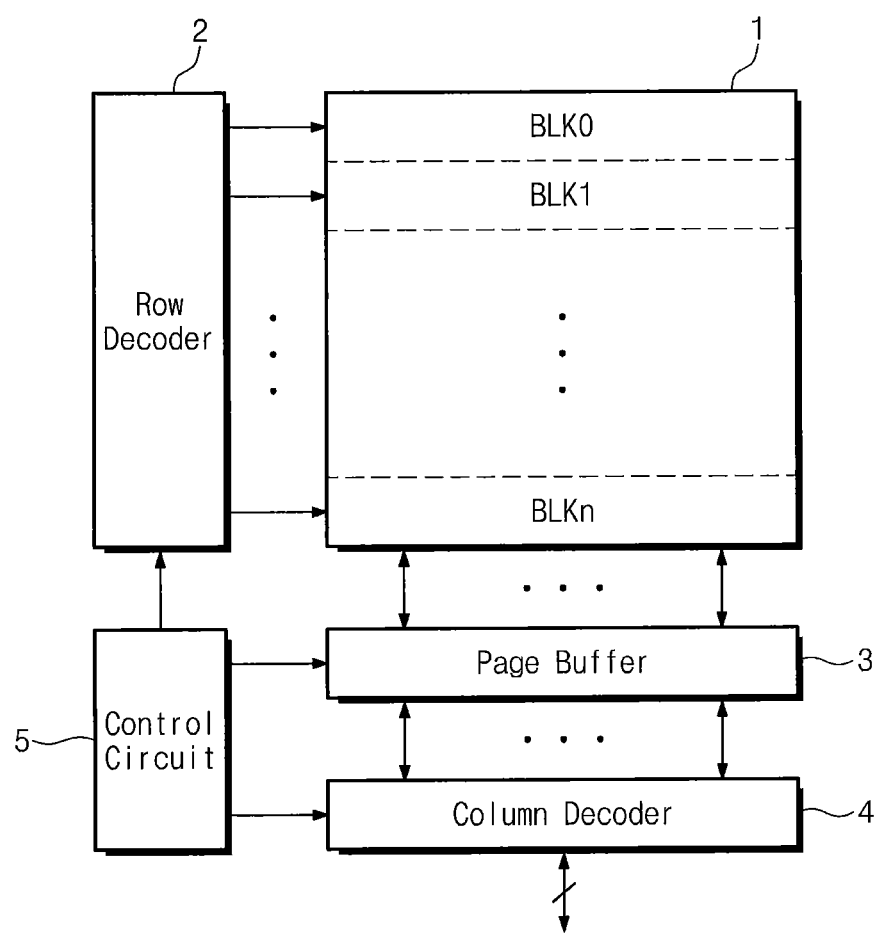
FIG. 1 is a schematic block diagram illustrating a three-dimensional (3D) semiconductor memory device according to some embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. Embodiments of the inventive concepts may, however, be embodied in different forms and should not be constructed as limited to embodiments set forth herein. Rather, these embodiments are provided so that this disclosure will be thorough and complete, and will fully convey the scope of the inventive concepts to those skilled in the art.

The terminology used herein is for the purpose of describing particular embodiments only and is not intended to be limiting of example embodiments. As used herein, the singular terms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept. The term "and/or" includes any and all combinations of one or more of the associated listed items.

Additionally, the embodiment in the detailed description will be described with sectional views as ideal exemplary views of the inventive concepts. Accordingly, shapes of the exemplary views may be modified according to manufacturing techniques and/or allowable errors. Therefore, embodiments of the inventive concepts are not limited to the specific shape illustrated in the exemplary views, but may include other shapes that may be created according to manufacturing processes.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of aspects of the present inventive concepts explained and illustrated herein include their complementary counterparts. The same reference numerals or the same reference designators denote the same elements throughout the specification.

FIG. 1 is a schematic block diagram illustrating a three-dimensional (3D) semiconductor memory device according to example embodiments of the inventive concepts.

Referring to FIG. 1, a 3D semiconductor memory device may include a memory cell array 1, a row decoder 2, a page buffer 3, a column decoder 4, and a control circuit 5.

The memory cell array 1 may include a plurality of memory blocks BLK0-BLKn, each of which may include a plurality of memory cells and a plurality of word and bit lines electrically connected to the memory cells.

The row decoder 2 may be configured to decode address information transmitted from an external device or otherwise from the outside and select one of the word lines based on the decoded address information. The address information decoded in the row decoder 2 may be transmitted to a row driver, and the row driver may supply word line voltages, which are generated by a voltage-generation circuit, to a selected word line and un-selected word lines, in response to the control of the control circuit 5. The row decoder 2 may be connected in common to the plurality of memory blocks BLK0-BLKn and may provide a driving signal to word lines of a selected one of the memory blocks BLK0-BLKn, based on a block selection signal.

The page buffer 3 may be connected to the memory cell array 1 through bit lines. The page buffer 3 may be connected to selected ones of the bit lines, based on address information decoded by the column decoder 4. Depending on an operation mode, each page buffer 3 may execute a process of temporarily storing data to be stored in the memory cells or of reading out data stored in the memory cells. For example, the page buffer 3 may function as a write driver in a program operation mode or as a sense amplifier in a read operation mode. The page buffer 3 may receive power (e.g., voltage or current) from the control circuit 5 and send it to the selected bit line.

The column decoder 4 may be configured to provide data-transmission paths between the page buffer 3 and an external device (e.g., a memory controller). The column decoder 4 may be configured to decode the address information transmitted from the outside and select one of the bit lines based on the decoded address information. The column decoder 4 may be connected in common to the plurality of memory blocks BLK0-BLKn and may provide data to the bit lines of one of the memory blocks BLK0-BLKn, which is selected on the basis of a block selection signal.

The control circuits 5 may be configured to control overall operations of the 3D semiconductor memory device. The control circuits 5 may receive a control signal and an external voltage and may perform a corresponding operation, based on the received control signal. The control circuits 5 may generate voltages (e.g., program, read, erase voltages, and so forth) necessary for internal operations by using the external voltage. The control circuits 5 may control read, write, and/or erase operations in response to the control signals.

Figure 2:
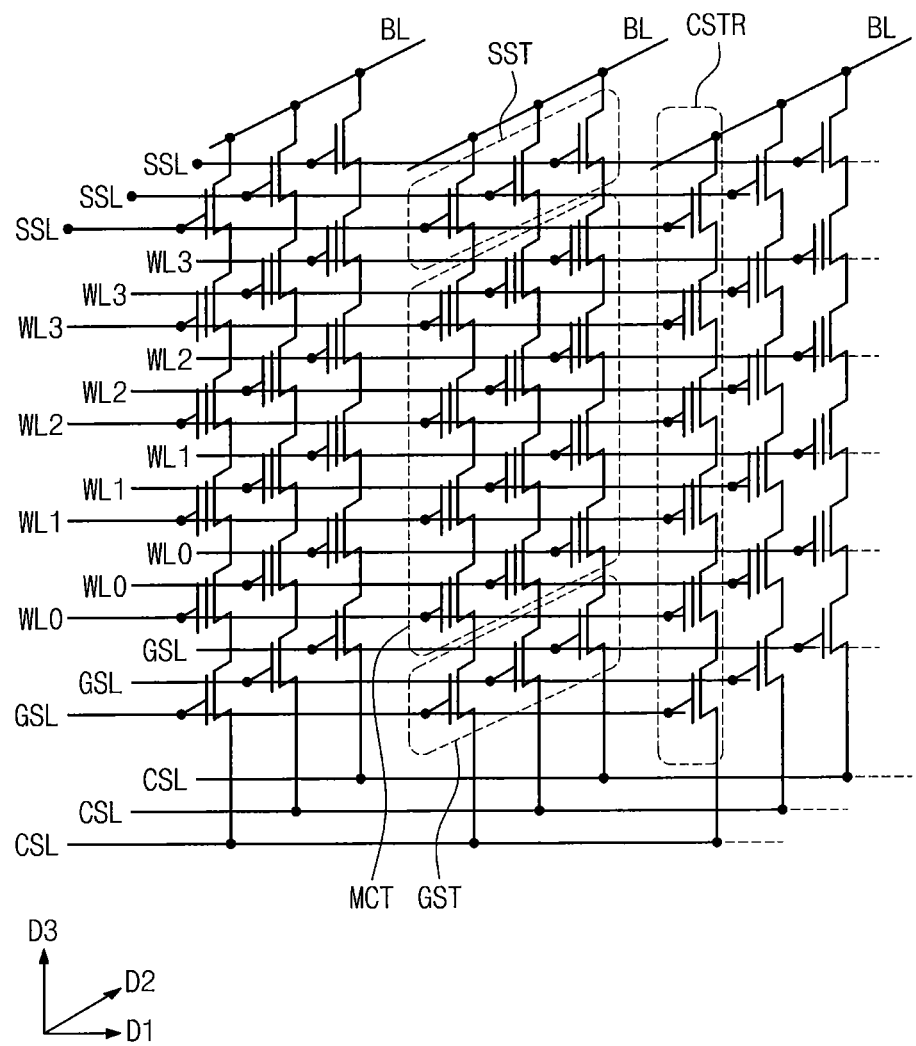
FIG. 2 is a circuit diagram illustrating a cell array of a 3D semiconductor memory device according to some embodiments of the inventive concepts.

FIG. 2 is a schematic circuit diagram illustrating a cell array of a 3D semiconductor memory device according to some embodiments of the inventive concepts.

Referring to FIG. 2, a cell array of a semiconductor memory device according to some embodiments of the inventive concepts may include a common source line CSL, a plurality of bit lines BL, and a plurality of cell strings CSTR disposed between the common source line CSL and the bit lines BL.

The bit lines BL may be two-dimensionally arranged and a plurality of the cell strings CSTR may be connected in parallel between each of the bit lines BL and the common source line CSL. That is, a plurality of the cell strings CSTR may be disposed between the common source line CSL and one of the bit lines BL. As an example, the cell array may include a plurality of two-dimensionally arranged common source lines CSL. In some embodiments, the common source lines CSL may be connected with each other and be in an equipotential state, but in certain embodiments, the common source lines CSL may be electrically separated from each other such that they can be controlled independently.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. The ground selection transistor GST, the memory cell transistors MCT, and the string selection transistor SST may be connected in series.

Sources regions of the ground selection transistors GST may be connected in common to the common source line CSL. In addition, at least one ground selection line GSL, a plurality of word lines WL0-WL3, and a plurality of string selection lines SSL may be disposed between the common source line CSL and the bit lines BL to serve as gate electrodes EL of the ground selection transistor GST, the memory cell transistors MCT, and the string selection transistors SST, respectively. Furthermore, each of the memory cell transistors MCT may include a data storage element or a data storing layer.

Figure 3:
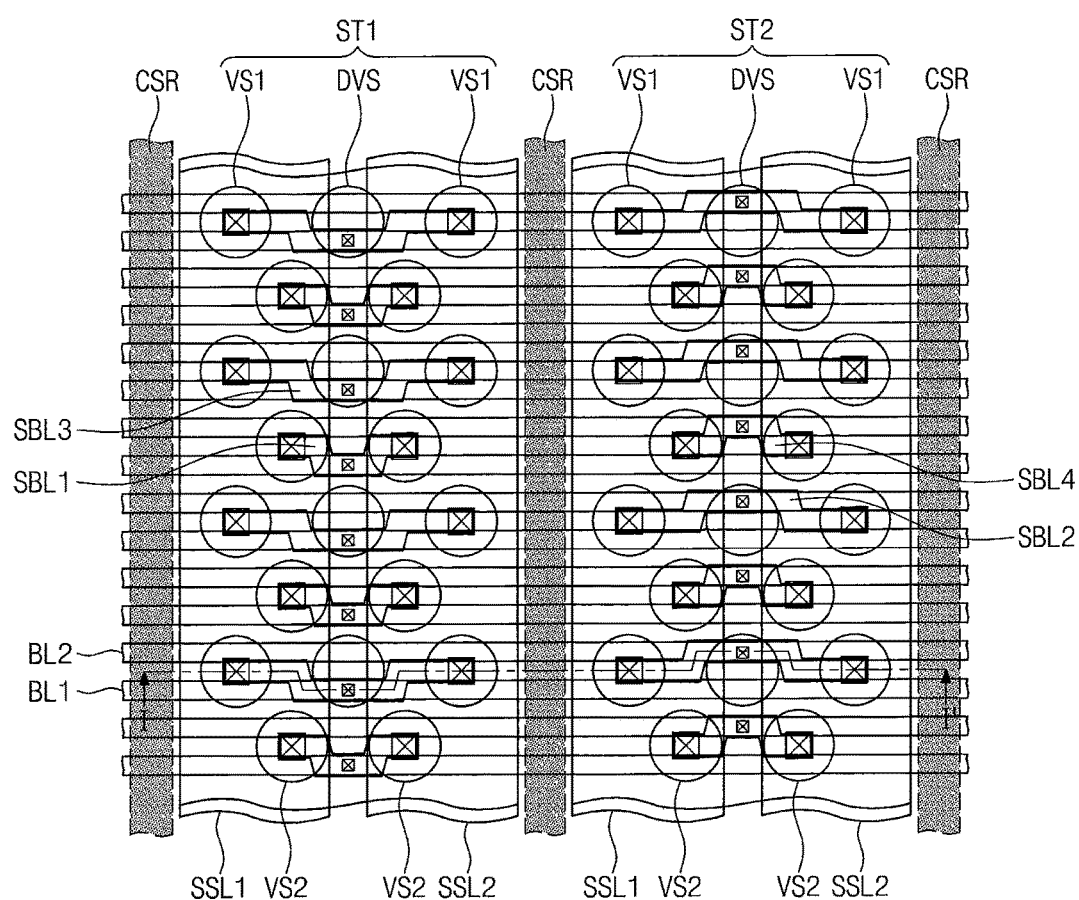
FIG. 3 is a plan view of a 3D semiconductor memory device according to some embodiments of the inventive concepts.
Figure 4:
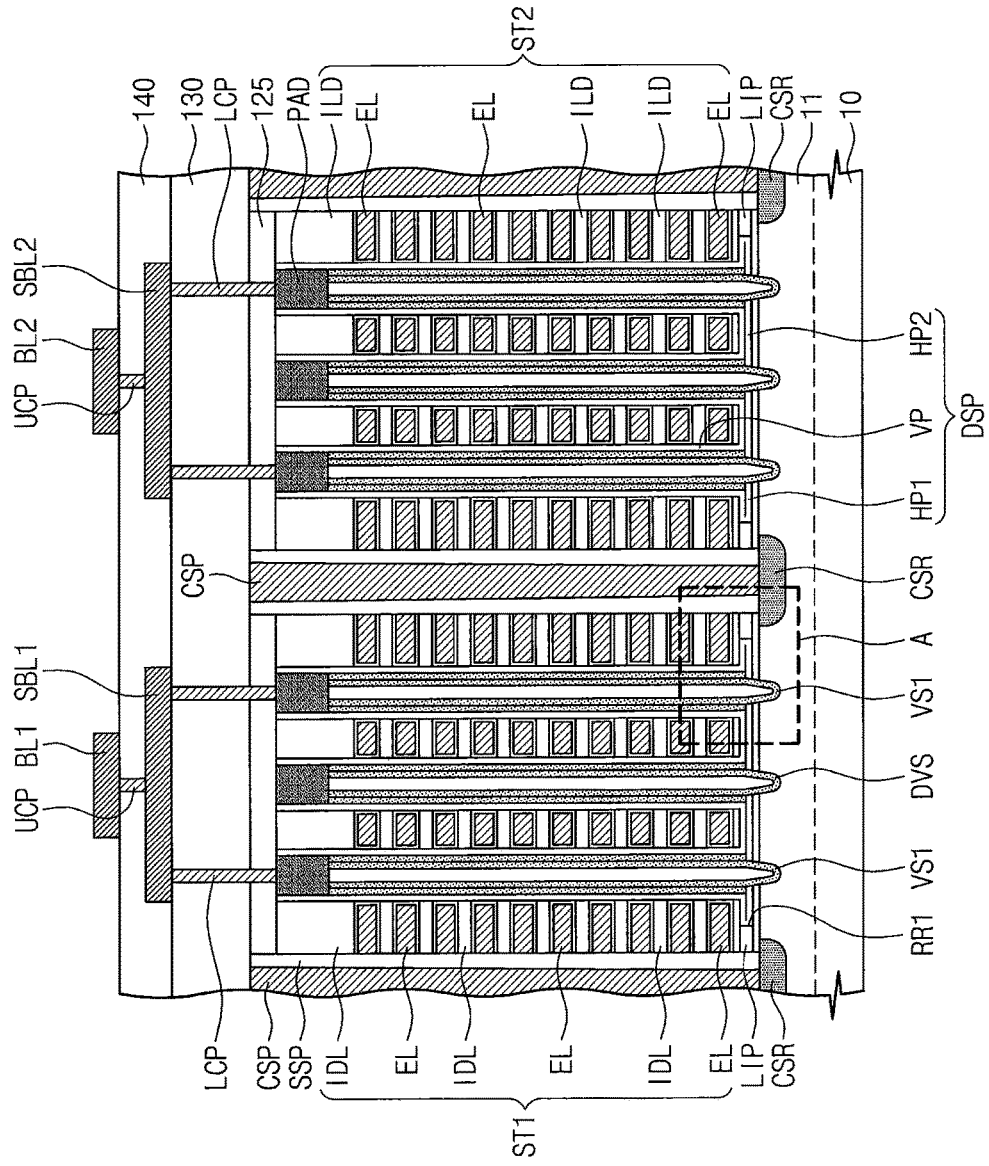
FIG. 4 is a sectional view taken along ling I-I' of FIG. 3 to illustrate a 3D semiconductor memory device according to some embodiments of the inventive concepts.
Figure 5:
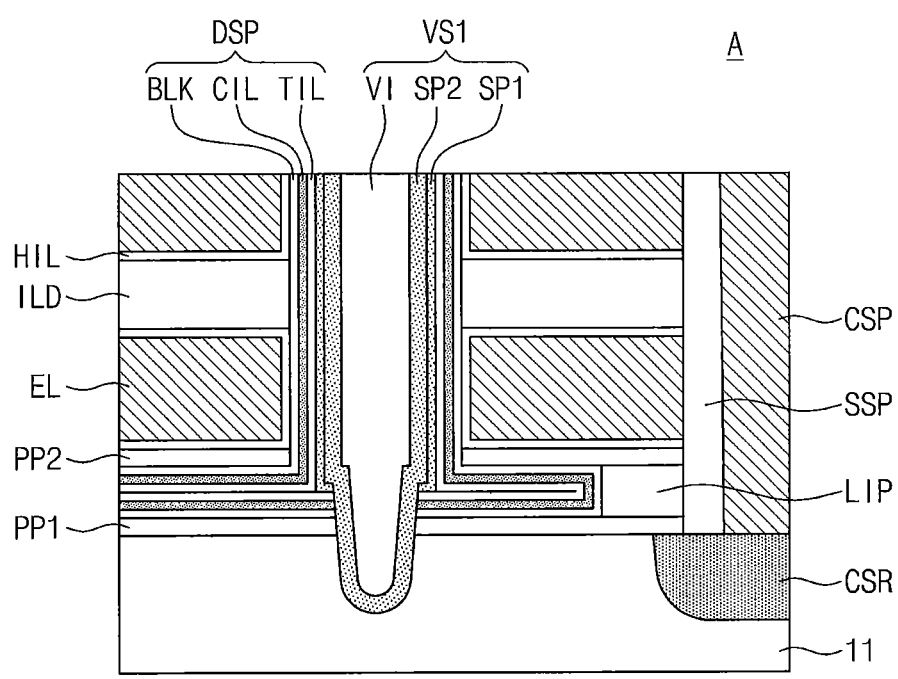
FIG. 5 is an enlarged sectional view of a portion 'A' of FIG. 4.

FIG. 3 is a plan view of a 3D semiconductor memory device according to some embodiments of the inventive concepts. FIGS. 4 and 5 are sectional views taken along ling I-I' of FIG. 3 to illustrate a 3D semiconductor memory device according to some embodiments of the inventive concepts.

Referring to FIGS. 3, 4, and 5, first and second stacks ST1 and ST2 (also referred to herein as electrode stacks) may be provided on a substrate 10 to extend parallel to a first direction D1 and to be spaced apart from each other in a second direction D2.

As an example, the substrate 10 may be formed of or include a semiconductor material and may include a well impurity layer 11 that is doped to have a first conductivity type. For example, the substrate 10 may be formed of or include at least one of silicon (Si), germanium (Ge), silicon germanium (SiGe), gallium arsenide (GaAs), indium gallium arsenide (InGaAs), aluminum gallium arsenide (AlGaAs), or compounds thereof. The substrate 10 may be, for example, a bulk silicon wafer, a silicon-on-insulator (SOI) wafer, a germanium wafer, a germanium-on-insulator wafer, a silicon-germanium substrate, or a substrate with an epitaxial layer formed by a selective epitaxial growth (SEG) process.

Each of the first and second stacks ST1 and ST2 may include conductive electrode patterns or electrodes EL, which are sequentially stacked on the substrate 10 in a vertical or third direction D3, and insulating layer patterns or insulating layers ILD, each of which is interposed between a vertically adjacent pair of the electrodes EL. The electrodes EL of the first and second stacks ST1 and ST2 may be formed of or include a conductive material; for example, the electrodes EL may include at least one of doped semiconductor (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth).

In some embodiments, the topmost electrodes of the first and second stacks ST1 and ST2 may be spaced apart from each other in a horizontal direction. For example, each of the first and second stacks ST1 and ST2 may include a first string selection electrode SSL1 and a second string selection electrode SSL2, which are spaced apart from each other in the second direction D2 and are disposed at the topmost level thereof to extend in the first direction D1, and an insulating separation pattern disposed between the first and second string selection electrodes SSL1 and SSL2.

In the first and second stacks ST1 and ST2, a thickness of each of the insulating layers ILD may be changed in consideration of technical requirements for the semiconductor memory device. As an example, the insulating layers ILD may have substantially the same thickness, or at least one of the insulating layers ILD may be thicker than the others of the insulating layers ILD. In some embodiments, the insulating layers ILD may be formed of or include a silicon oxide layer or a low-k dielectric layer. As an example, the insulating layers ILD may be formed to have pores and/or at least one air gap.

In some embodiments, the 3D semiconductor memory device may be a vertical-type NAND FLASH memory device. In this case, the topmost and lowermost ones of the electrodes EL may be used as gate electrodes of the selection transistors SST and GST of FIG. 2, and the others of the electrodes EL therebetween may be used as control gate electrodes of the memory cell transistors MCT of FIG. 2 and as word lines connecting them. Furthermore, the uppermost ones (e.g., the first and second string selection electrodes SSL1 and SSL2) of the electrodes EL may be used as a gate electrode of the string selection transistor (e.g., SST of FIG. 2) for controlling an electric connection between a bit line BL and vertical structures VS1 and VS2, and the lowermost one of the electrodes EL may be used as a gate electrode of the ground selection transistor (e.g., GST of FIG. 2) for controlling an electric connection between a common source plug CSP and vertical structures VS1, VS2, and DVS.

Lower insulating patterns LIP may be disposed between each of the first and second stacks ST1 and ST2 and the substrate 10. The lower insulating patterns LIP may be disposed to be spaced apart from each other and may be provided below and adjacent to both sidewalls of each of the first and second stacks ST1 and ST2. For example, the first and second stacks ST1 and ST2 may be respectively disposed on the lower insulating patterns LIP spaced apart from each other. The lower insulating patterns LIP may extend parallel to the first and second stacks ST1 and ST2 or in the first direction D1 and may be overlapped with the first and second stacks ST1 and ST2, when viewed in a plan view. In some embodiments, the lower insulating patterns LIP may be provided to be thinner than the electrodes EL and be thicker than that of a data storing pattern DSP interposed between the stacks ST1 and ST2 and the vertical structures VS1, VS2, and DVS.

The vertical structures VS1, VS2, and DVS may be provided to pass through each of the first and second stacks ST1 and ST2 and may be connected to the substrate 10. The vertical structures VS1, VS2, and DVS may be disposed between the lower insulating patterns LIP spaced apart from each other. The vertical structures may also be referred to herein as vertical channel structures.

In some embodiments, the vertical structures VS1, VS2, and DVS may include first and second vertical structures VS1 and VS2 and dummy vertical structures DVS. The first vertical structures VS1 may be arranged to be spaced apart from each other in the first and second directions D1 and D2. The second vertical structures VS2 may be arranged to be spaced apart from each other in the first and second directions D1 and D2, and each of them may be disposed in a diagonal direction relative to an adjacent one of the first vertical structures VS1. In other words, the first and second vertical structures VS1 and VS2 may be disposed to form a zigzag arrangement. In each of the first and second stacks ST1 and ST2, the dummy vertical structures DVS may be arranged to be spaced apart from each other in the first direction D1 and may be disposed between the first and second string selection electrodes SSL1 and SSL2. Each of the dummy vertical structures DVS may be disposed between an adjacent pair of the first vertical structures VS1 in the second direction D2 and may be disposed in the diagonal direction relative to an adjacent one of the second vertical structures VS2.

In some embodiments, each of the first and second vertical structures VS1 and VS2 and the dummy vertical structures DVS may be formed have a hollow cylindrical (or pipe-like) shape or a cup shape. Alternatively, each of the first and second vertical structures VS1 and VS2 and the dummy vertical structures DVS may have a circular pillar shape.

The first and second vertical structures VS1 and VS2 and the dummy vertical structures DVS may be formed of an undoped semiconductor material or a doped semiconductor material having the same conductivity type (e.g., the first conductivity type) as the well impurity layer 11. The first and second vertical structures VS1 and VS2 and the dummy vertical structures DVS may be formed to have one of polycrystalline, amorphous, and single-crystalline structures.

As shown in FIG. 5, each of the vertical structures VS1, VS2, and DVS may include a first semiconductor pattern SP1, a second semiconductor pattern SP2, and an insulating gap-fill pattern VI. The first semiconductor pattern SP1 may be a hollow structure with open top and bottom and may be provided to pass through the first and second stacks ST1 and ST2. The second semiconductor pattern SP2 may be provided to extend on or cover an inner side surface of the first semiconductor pattern SP1 and a top surface of the substrate 10. The second semiconductor pattern SP2 may be provided to have a hollow cylindrical structure, and an inner space thereof may be filled with the insulating gap-fill pattern VI.

A bottom surface of the second semiconductor pattern SP2 may be lower than a bottom surface of the first semiconductor pattern SP1. Also, the bottom surface of the second semiconductor pattern SP2 may be lower than the top surface of the substrate 10. For example, the bottom surface of the first semiconductor pattern SP1 may be in contact with the data storing pattern DSP, and a portion of the sidewall of the second semiconductor pattern SP2 may be in contact with a portion of the data storing pattern DSP.

In addition, conductive pads PAD may be provided on or in top portions of the first and second vertical structures VS1 and VS2 and the dummy vertical structures DVS. Bottom surfaces of the conductive pads PAD may be lower than a top surface of the topmost one of the electrodes EL. The conductive pads PAD may be doped with impurities or may be formed of a conductive material. In some embodiments, the conductive pads PAD may have a second conductivity type different from the first conductivity type of the well impurity layer 11. A capping insulating pattern 125 may be provided on the first and second stacks ST1 and ST2 to extend on or cover top surfaces of the conductive pads PAD.

The data storing pattern DSP may be interposed between the first and second stacks ST1 and ST2 and the vertical structures VS1, VS2, and DVS. The data storing pattern DSP may include a portion interposed between the top surface of the substrate 10 and a bottom surface of the lowermost one of the electrodes EL. The data storing pattern DSP may be horizontally or laterally extended from regions between the first and second stacks ST1 and ST2 and the vertical structures VS1, VS2, and DVS, in a continuous manner (i.e., without discontinuity or otherwise free of a discontinuous interface), to extend on or cover the bottom surfaces of the first and second stacks ST1 and ST2. In other words, the data storing pattern DSP may continuously extend from a region between the first and second stacks ST1 and ST2 and the vertical structures VS1, VS2, and DVS to a region between the top surface of the substrate 10 and a bottom surface of the lowermost one of the electrodes EL.

For example, the data storing pattern DSP may include a vertical portion VP and a horizontal or laterally extending portion. The vertical portion VP of the data storing pattern DSP may be interposed between the first or second stack ST1 or ST2 and the vertical structures VS1, VS2, and DVS. The horizontal or laterally extending portion of the data storing pattern DSP may be interposed between the top surface of the substrate 10 and the bottom surface of the first or second stack ST1 or ST2. In some embodiments, the vertical structures VS1, VS2, and DVS may be provided to pass through the horizontal or laterally extending portion of the data storing pattern DSP and to be connected to the substrate 10. In other words, the horizontal or laterally extending portion of the data storing pattern DSP may include a first horizontal or laterally extending portion HP1 and a second horizontal or laterally extending portion HP2. The first horizontal or laterally extending portion HP1 of the data storing pattern DSP may be disposed between the substrate 10 and the first or second stack ST1 or ST2 and be in contact with the lower insulating pattern LIP. The second horizontal or laterally extending portion HP2 of the data storing pattern DSP may be disposed between the substrate 10 and the first or second stack ST1 or ST2 and between adjacent ones of the vertical structures VS1, VS2, and DVS. In some embodiments, the first and second horizontal or laterally extending portions HP1 and HP2 of the data storing pattern DSP may be spaced apart from the substrate 10.

In the case where the 3D semiconductor memory device is a vertical-type NAND flash memory device, the data storing pattern DSP may include a tunnel insulating layer TIL, a charge storing layer CIL, and a blocking insulating layer BLK, as shown in FIG. 5. Data stored in the data storing pattern DSP may be changed using a Fowler-Nordheim (FN) tunneling effect, which may be caused by a voltage difference the vertical structures VS1, VS2, and DVS containing a semiconductor material and the electrodes EL. In certain embodiments, the data storing pattern DSP may include a layer (for example, exhibiting a phase-changeable or variable resistance property), which is configured to store data therein based on other physical effect.

In the data storing pattern DSP, the charge storing layer CIL may be one of an insulating layer with many trap sites and an insulating layer with nano particles and may be formed by a CVD or atomic layer deposition (ALD) process. For example, the charge storing layer CIL may be formed of or include a trap insulating layer, a floating gate electrode, or an insulating layer containing conductive nano dots. In certain embodiments, the charge storing layer CIL may be formed of or include at least one of a silicon nitride layer, a silicon oxynitride layer, a silicon-rich nitride layer, a nanocrystalline silicon layer, or a laminated trap layer. The tunnel insulating layer TIL may be one of materials having a greater band gap than the charge storing layer CIL and be formed by a CVD or ALD process. For example, the tunnel insulating layer TIL may be a silicon oxide layer, which may be formed by one of the afore-described deposition techniques. Alternatively, the tunnel insulating layer TIL may be formed of or include one of high-k dielectrics (e.g., aluminum oxide and hafnium oxide). The blocking insulating layer BLK may be one of materials, whose band gaps are smaller than that of the tunnel insulating layer TL and larger than that of the charge storing layer CL. The blocking insulating layer BLK may include at least one of high-k dielectrics (e.g., aluminum oxide and hafnium oxide). The blocking insulating layer BLK may be formed by a CVD or ALD process and may be formed by a wet oxidation process. The blocking insulating layer BLK may include first and second blocking insulating layers, and in this case, the first blocking insulating layer may be formed of or include one of high-k dielectrics (e.g., aluminum oxide and hafnium oxide) and the second blocking insulating layer may be formed of or include a material, whose dielectric constant is lower than that of the first blocking insulating layer. Alternatively, the second blocking insulating layer may be formed of one of the high-k dielectrics, and the first blocking insulating layer may be formed of a material, whose dielectric constant is lower than the second blocking insulating layer.

In addition, a first protection insulating pattern PP1 may be interposed between the horizontal or laterally extending portion of the data storing pattern DSP and the substrate 10, and a second protection insulating pattern PP2 may be interposed between the horizontal or laterally extending portion of the data storing pattern DSP and the lowermost one of the electrodes EL. Here, the first and second protection insulating patterns PP1 and PP2 may be formed of an insulating material different from the lower insulating patterns LIP. Furthermore, the first and second protection insulating patterns PP1 and PP2 may be formed of insulating materials having an etch selectivity with respect to each other. For example, the first and second protection insulating patterns PP1 and PP2 may include at least one of a silicon oxide layer, a silicon oxynitride layer, or a silicon nitride layer.

Furthermore, a horizontal insulating pattern HIL may be provided between the data storing pattern DSP and the electrode EL and may extend to cover top and bottom surfaces of each of the electrodes EL. In addition, the horizontal insulating pattern HIL may be provided to have a portion interposed between the first and second string selection electrodes SSL1 and SSL2 and the insulating separation pattern. In the case where the 3D semiconductor memory device is a vertical-type NAND flash memory device, the horizontal insulating pattern HIL may serve as a part of the blocking layer.

A common source region CSR may be provided in the substrate 10 between the first and second stacks ST1 and ST2. The common source regions CSR may extend parallel to the first direction D1 and may be spaced apart from each other in the second direction D2. The common source region CSR may be adjacent to the lower insulating patterns LIP and may be doped to have the second conductivity type or to have a conductivity type different from that of the well impurity layer 11.

Sidewall insulating spacers SSP may be provided between the first and second stacks ST1 and ST2 to extend on or cover the sidewalls of the first and second stacks ST1 and ST2, and a common source plug CSP may be coupled to the common source region CSR through a region between the sidewall insulating spacers SSP. The common source plug CSP may extend parallel to the first direction D1 and may be formed in such a way that an upper width is greater than a lower width. In some embodiments, the sidewall insulating spacer SSP may be provided between adjacent ones of the first and second stacks ST1 and ST2 to face each other, and a lower portion of the sidewall insulating spacer SSP may extend on or cover the sidewalls of the lower insulating patterns LIP.

The sidewall insulating spacer SSP may be formed of or include at least one of silicon oxide, silicon nitride, silicon oxynitride, or low-k dielectric materials. The common source plug CSP may include at least one of metals (e.g., tungsten, copper or aluminum), conductive metal nitrides (e.g., titanium nitride, or tantalum nitride), and transition metals (e.g., titanium or tantalum).

A first insulating layer 130 may be provided on the substrate 10 to extend on or cover the first and second stacks ST1 and ST2 and the common source plugs CSP. First, second, third, and fourth subsidiary lines SBL1, SBL2, SBL3, and SBL4 may be provided on the first insulating layer 130. The first and third subsidiary lines SBL1 and SBL3 may be provided on the first stack ST1, and the second and fourth subsidiary lines SBL2 and SBL4 may be provided on the second stack ST2.

The first subsidiary lines SBL1 may be electrically connected to the first vertical structures VS1 passing through the first stack ST1 through lower contact plugs LCP. Each of the third subsidiary lines SBL3 may be electrically connected to the second vertical structures VS2 passing through the first stack ST1 by the lower contact plugs LCP.

The second subsidiary lines SBL2 may be electrically connected to the first vertical structures VS1 passing through the second stack ST2 by the lower contact plugs LCP. The fourth subsidiary lines SBL4 may be electrically connected to the second vertical structures VS2 passing through the second stack ST2 by the lower contact plugs LCP.

A second insulating layer 140 may be provided on the first insulating layer 130 to extend on or cover the first to fourth subsidiary lines SBL1-SBL4, and the first and second bit lines BL1 and BL2 may be provided on the second insulating layer 140. The first and second bit lines BL1 and BL2 may extend parallel to the second direction D2 and may be alternately disposed in the first direction D1.

Each of the first bit lines BL1 may be connected to the first and third subsidiary lines SBL1 and SBL3 through upper contact plugs UCP, and each of the second bit lines BL2 may be connected to the second and fourth subsidiary lines SBL2 and SBL4 through the upper contact plugs UCP.

Figure 6:
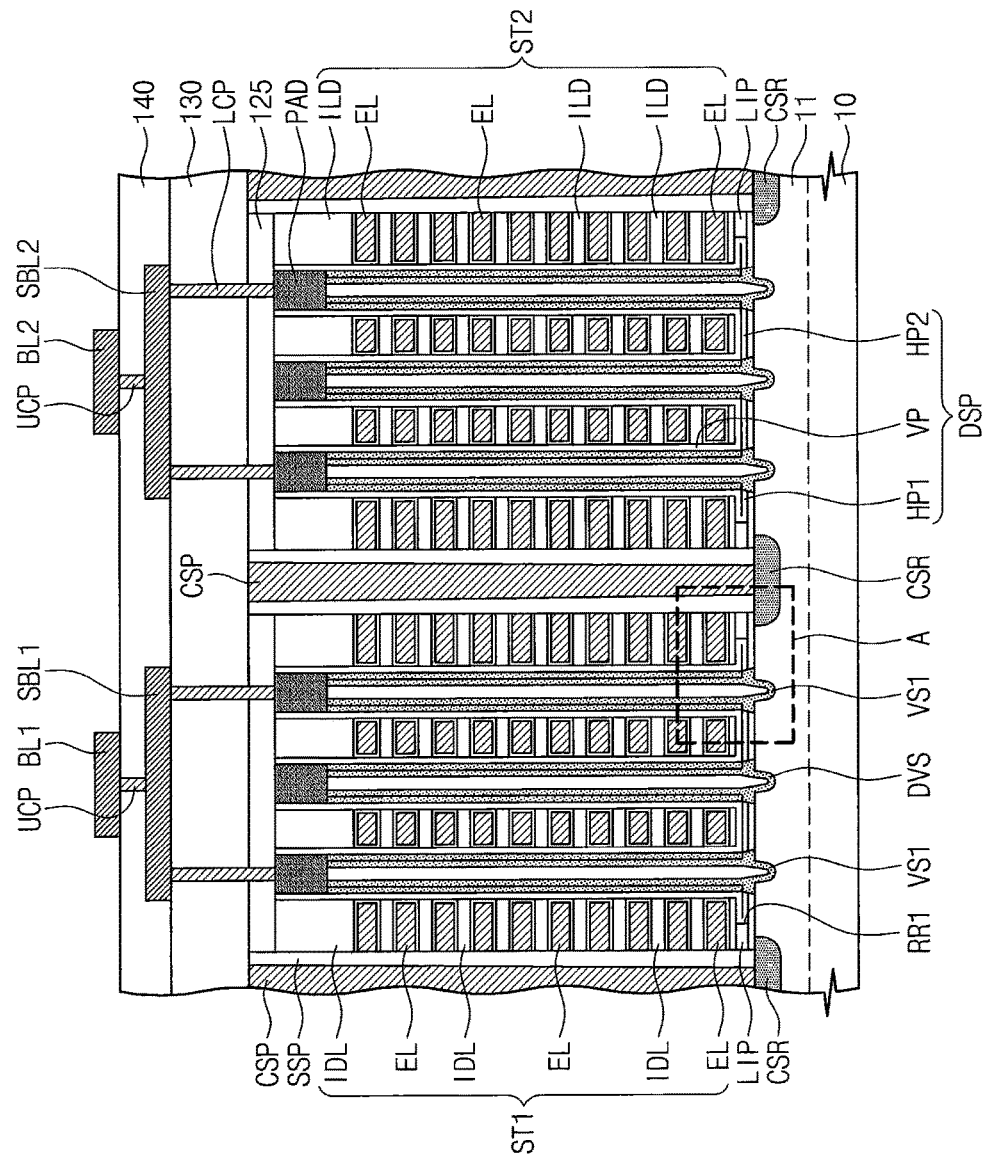
FIG. 6 is a sectional view taken along ling I-I' of FIG. 3 to illustrate a 3D semiconductor memory device according to some embodiments of the inventive concepts.
Figure 7:
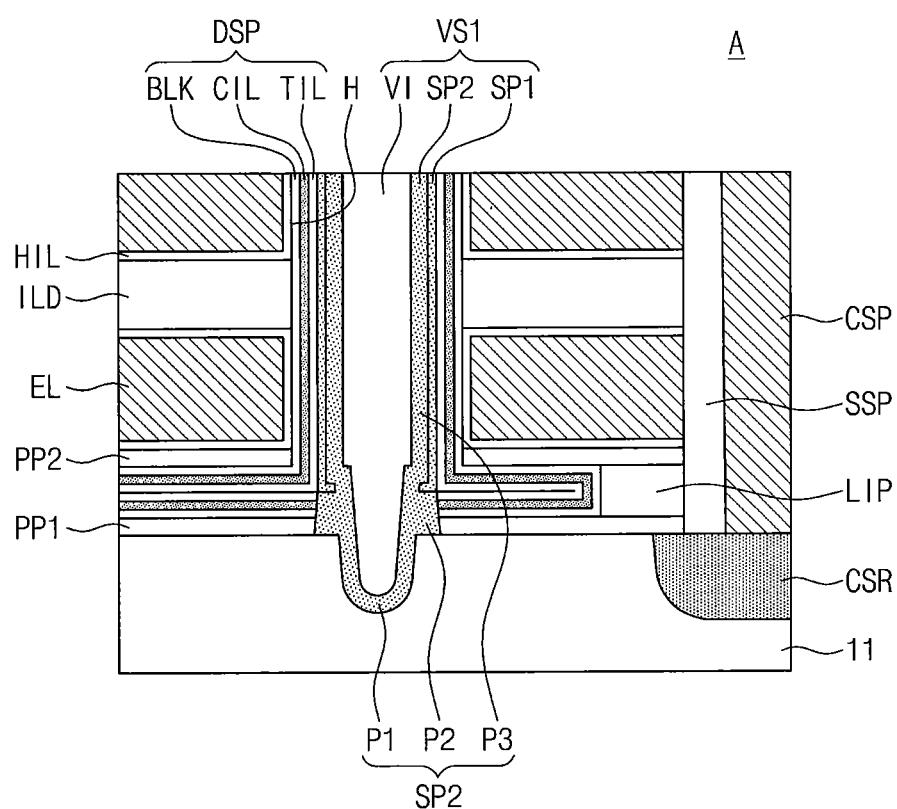
FIG. 7 is an enlarged sectional view of a portion 'A' of FIG. 6.

FIG. 6 is a sectional view taken along ling I-I' of FIG. 3 to illustrate a 3D semiconductor memory device according to some embodiments of the inventive concepts, and FIG. 7 is an enlarged sectional view of a portion 'A' of FIG. 6. For concise description, an element previously described with reference to FIGS. 3 and 4 may be identified by a similar or identical reference number without repeating an overlapping description thereof.

Referring to FIGS. 6 and 7, the first and second stacks ST1 and ST2 may be provided on the substrate 10 to extend parallel the first direction D1 and be spaced apart from each other in the second direction D2. The lower insulating patterns LIP may be disposed between the substrate 10 and each of the first and second stacks ST1 and ST2. The lower insulating patterns LIP may be provided below each of the first and second stacks ST1 and ST2 to extend in the first direction D1 and may be disposed to be spaced apart from each other. The lower insulating patterns LIP may be aligned to both sidewalls of each of the first and second stacks ST1 and ST2.

The vertical structures VS1, VS2, and DVS may be provided to pass through each of the first and second stacks ST1 and ST2 and may be connected to the substrate 10. The vertical structures VS1, VS2, and DVS may be disposed between the lower insulating patterns LIP, and as described above, the vertical structures VS1, VS2, and DVS may include the first and second vertical structures VS1 and VS2 and the dummy vertical structures DVS.

In some embodiments, the vertical structures VS1, VS2, and DVS may be provided in such a way that a portion positioned between the substrate 10 and the first or second stack ST1 or ST2 has a larger width than that of a portion inserted into the substrate 10. Each of the vertical structures VS1, VS2, and DVS may include the first semiconductor pattern SP1, the second semiconductor pattern SP2, and the insulating gap-fill pattern VI, as shown in FIG. 7.

The first semiconductor pattern SP1 may be a hollow structure with open top and bottom and may be provided to pass through the first and second stacks ST1 and ST2. The second semiconductor pattern SP2 may be provided to extend on or cover the inner side surface of the first semiconductor pattern SP1 and the top surface of the substrate 10. The second semiconductor pattern SP2 may be provided to have a hollow cylindrical structure, and the inner space thereof may be filled with the insulating gap-fill pattern VI. The bottom surface of the second semiconductor pattern SP2 may be lower than the bottom surface of the first semiconductor pattern SP1 and the top surface of the substrate 10.

In some embodiments, the second semiconductor pattern SP2 may include a contact portion P1 inserted into the substrate 10, a body portion P3 vertically crossing the electrodes EL, and an enlarged portion P2 between the contact and body portions P1 and P3. The width of the second semiconductor pattern SP2 may be the maximum at the enlarged portion P2. The enlarged portion P2 of the second semiconductor pattern SP2 may be in contact with the data storing pattern DSP and the first semiconductor pattern SP1 may be provided on the enlarged portion P2 of the second semiconductor pattern SP2.

The data storing pattern DSP may be interposed between the vertical structures VS1, VS2, and DVS and the first and second stacks ST1 and ST2. In the case where the 3D semiconductor memory device is a vertical-type NAND flash memory device, the data storing pattern DSP may include a tunnel insulating layer TIL, a charge storing layer CIL, and a blocking insulating layer BLK, as shown in FIG. 7. Data stored in the data storing pattern DSP may be changed using a Fowler-Nordheim (FN) tunneling effect, which may be caused by a voltage difference the vertical structures VS1, VS2, and DVS containing a semiconductor material and the electrodes EL. In certain embodiments, the data storing pattern DSP may include a layer (for example, exhibiting a phase-changeable or variable resistance property), which is configured to store data therein based on other physical effect.

The data storing pattern DSP may be horizontally or laterally extended from regions between the first and second stacks ST1 and ST2 and the vertical structures VS1, VS2, and DVS, in a continuous manner (i.e., without discontinuity or otherwise free of a discontinuous interface), to extend on or cover the bottom surfaces of the first and second stacks ST1 and ST2. For example, the data storing pattern DSP may include the vertical portion VP, which is interposed between the first or second stack ST1 or ST2 and the vertical structures VS1, VS2, and DVS, and the horizontal or laterally extending portion, which is interposed between the top surface of the substrate 10 and the bottom surface of the first or second stack ST1 or ST2. The horizontal or laterally extending portion of the data storing pattern DSP may include the first horizontal or laterally extending portion HP1, which is provided between the substrate 10 and the first or second stack ST1 or ST2 to be in contact with the lower insulating patterns LIP, and the second horizontal or laterally extending portion HP2, which is provided between the substrate 10 and the first or second stack ST1 or ST2 and between adjacent ones of the vertical structures VS1, VS2, and DVS. The first and second horizontal or laterally extending portions HP1 and HP2 of the data storing pattern DSP may be spaced apart from the substrate 10.

Furthermore, the first protection insulating pattern PP1 may be disposed between the substrate 10 and the lower insulating patterns LIP, and the second protection insulating pattern PP2 may be disposed between the stacks and the lower insulating patterns LIP. The first protection insulating pattern PP1 may include a portion between the horizontal or laterally extending portion of the data storing pattern DSP and the substrate 10, and the second protection insulating pattern PP2 may include a portion between the horizontal or laterally extending portion of the data storing pattern DSP and the stack.

The common source regions CSR may be provided in the substrate 10 between the first and second stacks ST1 and ST2, and the common source plug CSP may be coupled to the common source regions CSR. The common source region CSR and the common source plug CSP may extend in the first direction D1. The sidewall insulating spacer SSP may be provided between the common source plug CSP and the first and second stacks ST1 and ST2, and the sidewalls of the lower insulating patterns LIP may be in contact with the sidewall insulating spacer SSP.

Figure 8:
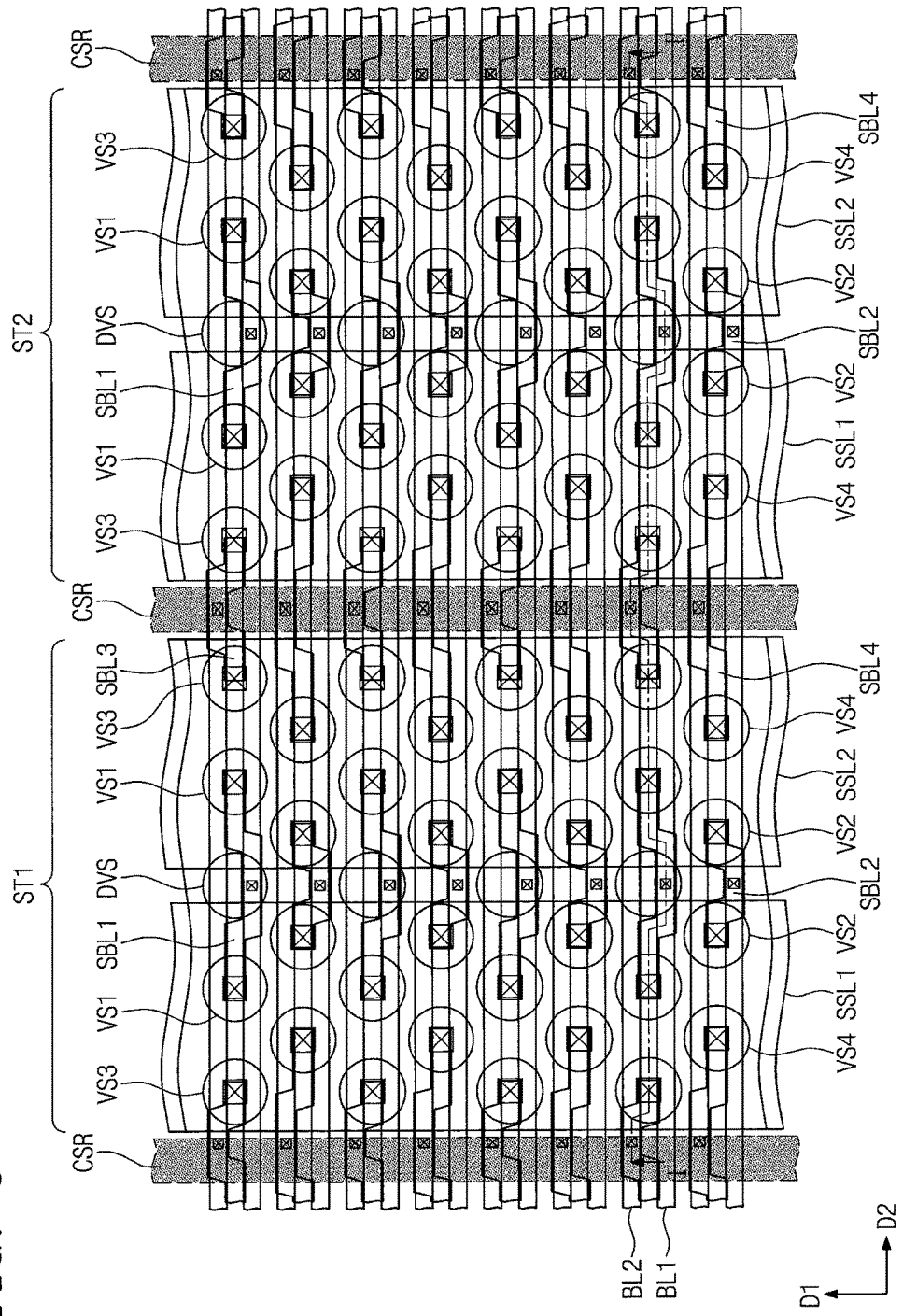
FIG. 8 is a plan view of a 3D semiconductor memory device according to some embodiments of the inventive concepts.
Figure 9:
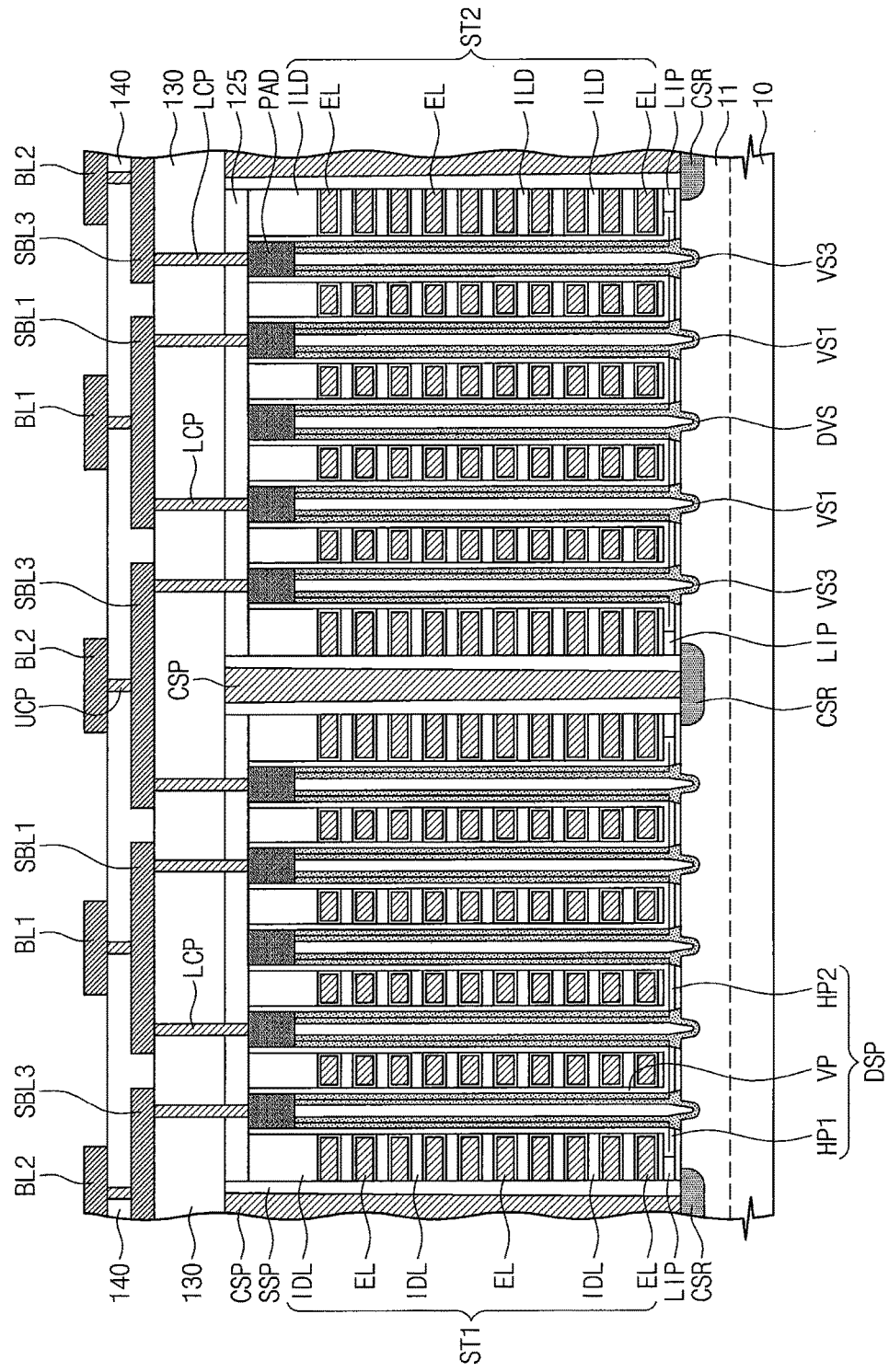
FIG. 9 is a sectional view taken along line I-I' of FIG. 6 to illustrate a 3D semiconductor memory device according to some embodiments of the inventive concepts.

FIG. 8 is a plan view of a 3D semiconductor memory device according to some embodiments of the inventive concepts. FIG. 9 is a sectional view taken along line I-I' of FIG. 8 to illustrate a 3D semiconductor memory device according to some embodiments of the inventive concepts. For concise description, an element previously described with reference to FIGS. 3 through 7 may be identified by a similar or identical reference number without repeating an overlapping description thereof.

Referring to FIGS. 8 and 9, the first and second stacks ST1 and ST2 may be provided on the substrate 10 to extend in the first direction D1 and be spaced apart from each other in the second direction D2. Each of the first and second stacks ST1 and ST2 may include a plurality of the electrodes EL, which are vertically stacked on the substrate 10, and the first and second string selection electrodes SSL1 and SSL2, which are provided at a highest level thereof. Here, the first and second string selection electrodes SSL1 and SSL2 may extend in the first direction D1 and may be spaced apart from each other in the second direction D2. Each of the first and second stacks ST1 and ST2 may include the insulating layers ILD interposed between the electrodes EL.

The lower insulating patterns LIP may be disposed between each of the first and second stacks ST1 and ST2 and the substrate 10. The lower insulating patterns LIP may be disposed to be spaced apart from each other and may be provided below and adjacent to both sidewalls of each of the first and second stacks ST1 and ST2. For example, the first and second stacks ST1 and ST2 may be respectively disposed on the lower insulating patterns LIP spaced apart from each other. The lower insulating patterns LIP may extend parallel to the first and second stacks ST1 and ST2 or in the first direction D1 and may be overlapped with the first and second stacks ST1 and ST2, when viewed in a plan view.

The vertical structures may be provided to pass through each of the first and second stacks ST1 and ST2 and may be connected to the substrate 10. In some embodiments, the vertical structures may include a plurality of first to fourth vertical structures VS1, VS2, VS3, and VS4 and a plurality of dummy vertical structures DVS. In the first and second stacks ST1 and ST2, the vertical structures VS1, VS2, VS3, VS4, and DVS may be disposed between the lower insulating patterns LIP. In other words, the first to fourth vertical structures VS1, VS2, VS3, and VS4 and the dummy vertical structures DVS may be disposed between the lower insulating patterns LIP.

The first to fourth vertical structures VS1, VS2, VS3, and VS4 and the dummy vertical structures DVS may be provided to pass through each of the first and second stacks ST1 and ST2. The dummy vertical structures DVS may be arranged between the first and second string selection electrodes SSL1 and SSL2 and in the first direction D1. The first vertical structures VS1 may be arranged to form a first column parallel to the first direction D1, the second vertical structures VS2 may be arranged to form a second column parallel to the first direction D1, the third vertical structures VS3 may be arranged to form a third column parallel to the first direction D1, and the fourth vertical structures VS4 may be arranged to form a fourth column parallel to the first direction D1.

The first to fourth vertical structures VS1-VS4 penetrating the first string selection electrode SSL1 and the first to fourth vertical structures VS1-VS4 penetrating the second string selection electrode SSL2 may be arranged to have mirror symmetry about the dummy vertical structures DVS interposed therebetween. Also, the first and third vertical structures VS1 and VS3 may be disposed in a diagonal direction with respect to the second and fourth vertical structures VS2 and VS4. Furthermore, the conductive pads PAD may be provided on or in top portions of the first to fourth vertical structures VS1-VS4 and the dummy vertical structures DVS.

The vertical structures VS1, VS2, VS3, VS4, and DVS may be inserted into and connected to (or may otherwise extend into) the substrate 10. Each of the vertical structures VS1, VS2, VS3, VS4, and DVS may include the first semiconductor pattern SP1, the second semiconductor pattern SP2, and the insulating gap-fill pattern VI, as described with reference to FIGS. 5 and 7.

The data storing pattern DSP may be disposed between the vertical structures VS1, VS2, VS3, VS4, and DVS and the first and second stacks ST1 and ST2. The data storing pattern DSP may be horizontally or laterally extended from regions between the first and second stacks ST1 and ST2 and the vertical structures VS1, VS2, VS3, VS4, and DVS, in a continuous manner (i.e., without discontinuity or otherwise free of a discontinuous interface), to extend on or cover the bottom surfaces of the first and second stacks ST1 and ST2. The data storing pattern DSP may include the vertical portion VP interposed between the stack and the vertical structures VS1, VS2, VS3, VS4, and DVS and the horizontal or laterally extending portions HP1 and HP2 that are disposed between the top surface of the substrate 10 and bottom surfaces of the first and second stacks ST1 and ST2. The horizontal or laterally extending portions HP1 and HP2 of the data storing pattern DSP may include the first horizontal or laterally extending portion HP1, which is provided between the substrate 10 and the first and second stacks ST1 and ST2 to be in contact with the lower insulating patterns LIP, the second horizontal or laterally extending portion HP2, which is disposed between the substrate 10 and the first and second stacks ST1 and ST2 and between adjacent ones of the vertical structures VS1, VS2, VS3, VS4, and DVS.

The first insulating layer 130 may be provided on the substrate 10 to extend on or cover the first and second stacks ST1 and ST2 and the common source plugs CSP. The first, second, third, and fourth subsidiary lines SBL1, SBL2, SBL3, and SBL4 may be provided on the first insulating layer 130.

In some embodiments, each of the first subsidiary lines SBL1 may be connected to the first vertical structures VS1, which are disposed adjacent to each other in the second direction D2, through the lower contact plugs LCP. Each of the second subsidiary lines SBL2 may be connected to the second vertical structures VS2, which are disposed adjacent to each other in the second direction D2, through the lower contact plug LCP. In some embodiments, the second subsidiary lines SBL2 may be shorter than the first subsidiary lines SBL1. Each of the third subsidiary lines SBL3 may be connected to the third vertical structures VS3, which are disposed adjacent to each other in the second direction D2, through the lower contact plug LCP. Each of the fourth subsidiary lines SBL4 may be connected to the fourth vertical structures VS4, which are disposed adjacent to each other in the second direction D2, through the lower contact plug LCP. In some embodiments, the fourth subsidiary lines SBL4 may be shorter than the third subsidiary lines SBL3.

The first and second subsidiary lines SBL1 and SBL2 may be provided on the first and second stacks ST1 and ST2, and the third and fourth subsidiary lines SBL3 and SBL4 may be provided to cross the common source plug CSP.

The second insulating layer 140 may be provided on the first insulating layer 130 to extend on or cover the first to fourth subsidiary lines SBL1-SBL4, and the first and second bit lines BL1 and BL2 may be provided on the second insulating layer 140. The first and second bit lines BL1 and BL2 may extend parallel to the second direction D2 and may be alternately disposed in the first direction D.

Each of the first bit lines BL1 may be connected to the first subsidiary lines SBL1 or the second subsidiary lines SBL2 through the upper contact plug UCP. Each of the second bit lines BL2 may be connected to the third subsidiary lines SBL3 or the fourth subsidiary lines SBL4 through the upper contact plug UCP.

Figure 10:
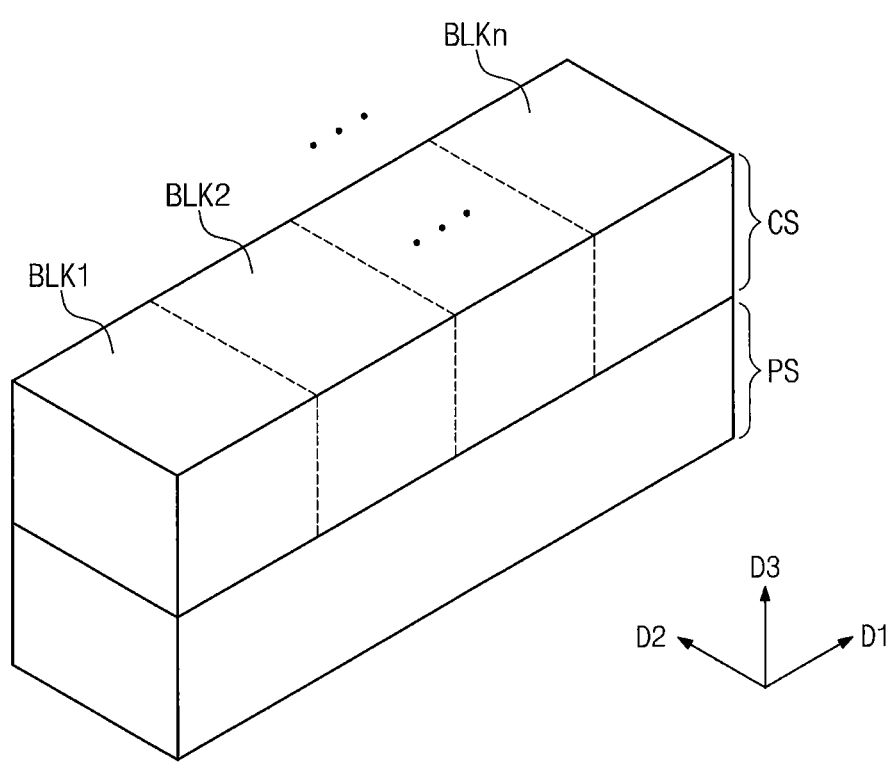
FIG. 10 is a schematic block diagram illustrating a 3D semiconductor memory device according to some embodiments of the inventive concepts.

FIG. 10 is a schematic block diagram illustrating a 3D semiconductor memory device according to some embodiments of the inventive concepts.

Referring to FIG. 10, a 3D semiconductor memory device may include a peripheral logic structure PS and a cell array structure CS stacked on the peripheral logic structure PS. When viewed in a plan view, the peripheral logic structure PS and the cell array structure CS may be overlapped with each other.

In some embodiments, the peripheral logic structure PS may include the row and column decoders 2 and 4, the page buffer 3, and the control circuits 5 described with reference to FIG. 1. The cell array structure CS may include a plurality of memory blocks BLK0-BLKn, each of which is configured to independently perform an erase operation. The peripheral logic structure PS may be provided on a plane defined by first and second directions D1 and D2, and the memory blocks BLK0-BLKn may be provided on the peripheral logic structure PS in a third direction D3 normal to the plane. Each of the memory blocks BLK0-BLKn may include a 3D memory cell array, in which memory cells are vertically stacked. The memory cell array may include a plurality of memory cells, which are three-dimensionally arranged, and word and bit lines, which are electrically connected to the memory cells, as described with reference to FIG. 2.

Figure 11:
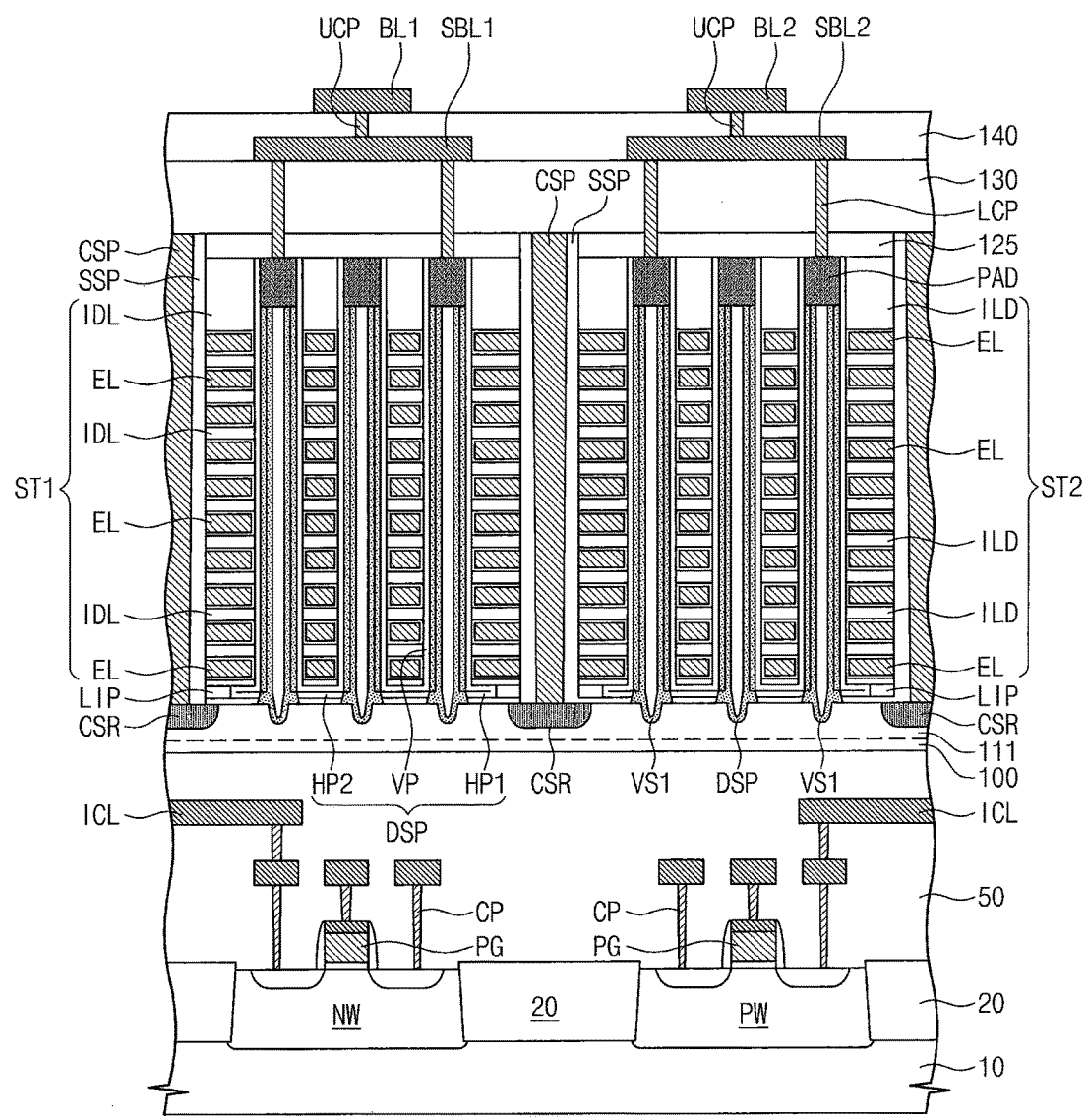
FIG. 11 is a sectional view of a 3D semiconductor memory device according to some embodiments of the inventive concepts.

FIG. 11 is a sectional view of a 3D semiconductor memory device according to some embodiments of the inventive concepts. For concise description, elements previously described with reference to FIGS. 3 through 7 may be identified by a similar or identical reference number without repeating and overlapping description thereof.

Referring to FIG. 11, the peripheral logic structure PS and the cell array structure CS may be sequentially stacked on the substrate 10. For example, the peripheral logic structure PS may be positioned between the substrate 10 and the cell array structure CS in their vertical levels. In other words, when viewed in a plan view, the peripheral logic structure PS may be overlapped with the cell array structure CS.

The substrate 10 may be, for example, a bulk silicon wafer, a silicon-on-insulator (SOI) wafer, a germanium wafer, a germanium-on-insulator wafer, a silicon-germanium substrate, or a substrate with an epitaxial layer formed by a selective epitaxial growth (SEG) process.

The peripheral logic structure PS may include the row and column decoders 2 and 4, the page buffer 3, and the control circuits 5, as described with reference to FIG. 1. In other words, the peripheral logic structure PS may include NMOS and PMOS transistors, at least one resistor, and at least one capacitor which are electrically connected to the cell array structure CS. Such peripheral circuits may be formed on the entire top surface of the substrate 10. The semiconductor substrate 10 may include an n-well region NW doped with n-type impurities and a p-well region PW doped with p-type impurities. The n-well region NW and the p-well region PW may include active regions defined by a device isolation layer 20. For example, PMOS transistors may be formed on the n-well region NW, and NMOS transistors may be formed on the p-well region PW. Peripheral circuit interconnections ICL may be electrically connected to the peripheral circuits via the peripheral contact plugs CP. For example, the peripheral circuit plugs CP and the peripheral circuit interconnections ICL may be connected to the NMOS and PMOS transistors.

The peripheral logic structure PS may include peripheral gate electrodes PG, source and drain impurity regions, which are formed at both sides of each of the peripheral gate electrodes PG, the peripheral contact plugs CP, the peripheral circuit interconnections ICL, and a lower interlayered insulating layer 50 on or covering peripheral circuits. The lower interlayered insulating layer 50 may extend on or cover the peripheral logic circuits, the peripheral contact plugs CP, and the peripheral circuit interconnections ICL. The lower interlayered insulating layer 50 may be a multi-layered structure including a plurality of insulating layers.

The cell array structure CS may be provided on the lower interlayered insulating layer 50 and may include a horizontally or laterally extending semiconductor layer 100, the stacks ST1 and ST2, and the vertical structures VS1, VS2, and DVS.

The semiconductor layer 100 may be formed on the top surface of the lower interlayered insulating layer 50 on or covering the peripheral circuits. In other words, a bottom surface of the semiconductor layer 100 may be in contact with the lower interlayered insulating layer 50. The semiconductor layer 100 may be formed of or include a semiconductor material; the semiconductor layer 100 may include at least one of silicon (Si), germanium (Ge), silicon germanium (SiGe), gallium arsenide (GaAs), indium gallium arsenide (InGaAs), aluminum gallium arsenide (AlGaAs), or compounds thereof. The semiconductor layer 100 may be formed of a doped semiconductor with a first conductivity type and/or an intrinsic semiconductor. The semiconductor layer 100 may be formed to have one of polycrystalline, amorphous, or single-crystalline structures. In addition, the semiconductor layer 100 may include a well impurity layer 111 that is doped to have the first conductivity type.

The first and second stacks ST1 and ST2 may be provided on the semiconductor layer 100 to extend in the first direction D1 and may be spaced apart from each other in the second direction D2. Each of the first and second stacks ST1 and ST2 may include a plurality of electrodes EL, which are vertically stacked on the semiconductor layer 100, and the insulating layers ILD interposed between the electrodes EL.

The lower insulating patterns LIP may be disposed between the semiconductor layer 100 and the first and second stacks ST1 and ST2. The lower insulating patterns LIP may be provided below each of the first and second stacks ST1 and ST2 to extend in the first direction D1 and may be disposed spaced apart from each other. The lower insulating patterns LIP may be aligned to both sidewalls of each of the first and second stacks ST1 and ST2.

The vertical structures VS1, VS2, and DVS may be connected to the semiconductor layer 100 by extending through the first and second stacks ST1 and ST2. The vertical structures VS1, VS2, and DVS may be disposed between the lower insulating patterns LIP, and as described above, the vertical structures VS1, VS2, and DVS may include the first and second vertical structures VS1 and VS2 and the dummy vertical structures DVS.

The data storing pattern DSP may be interposed between the vertical structures VS1, VS2, and DVS and the first and second stacks ST1 and ST2. The data storing pattern DSP may be horizontally or laterally extended from regions between the first and second stacks ST1 and ST2 and the vertical structures VS1, VS2, and DVS, in a continuous manner (i.e., without discontinuity or otherwise free of a discontinuous interface), to extend on or cover the bottom surfaces of the first and second stacks ST1 and ST2.

The data storing pattern DSP may include the vertical portion VP, which is interposed between the first or second stack ST1 or ST2 and the vertical structures VS1, VS2, and DVS, and the horizontal or laterally extending portion, which is interposed between and the top surface of the semiconductor layer 100 and the bottom surface of the first or second stack ST1 or ST2. The horizontal or laterally extending portion of the data storing pattern DSP may include the first horizontal or laterally extending portion HP1, which are provided between the semiconductor layer 100 and the first and second stacks ST1 and ST2 to be in contact with the lower insulating patterns LIP, and the second horizontal or laterally extending portion HP2, which is provided between the semiconductor layer 100 and the first and second stacks ST1 and ST2 and between adjacent ones of the vertical structures VS1, VS2, and DVS.

The common source regions CSR may be provided in the semiconductor layer 100 between the first and second stacks ST1 and ST2, and the common source plug CSP may be coupled to the common source regions CSR. The common source region CSR and the common source plug CSP may extend in the first direction D1. The sidewall insulating spacer SSP may be provided between the common source plug CSP and the first and second stacks ST1 and ST2, and the sidewalls of the lower insulating patterns LIP may be in contact with the sidewall insulating spacer SSP.

As described with reference to FIG. 3, the first to fourth subsidiary lines SBL1, SBL2, SBL3, and SBL4 may be disposed on the first insulating layer 130 on or covering the first and second stacks ST1 and ST2. The first and second bit lines BL1 and BL2 may be disposed on the second insulating layer 140 on or covering the first to fourth subsidiary lines SBL1, SBL2, SBL3, and SBL4.

FIGS. 12 through 21 are sectional views taken along line I-I' of FIG. 3 to illustrate a method of fabricating a 3D semiconductor memory device, according to some embodiments of the inventive concepts.

Figure 12:
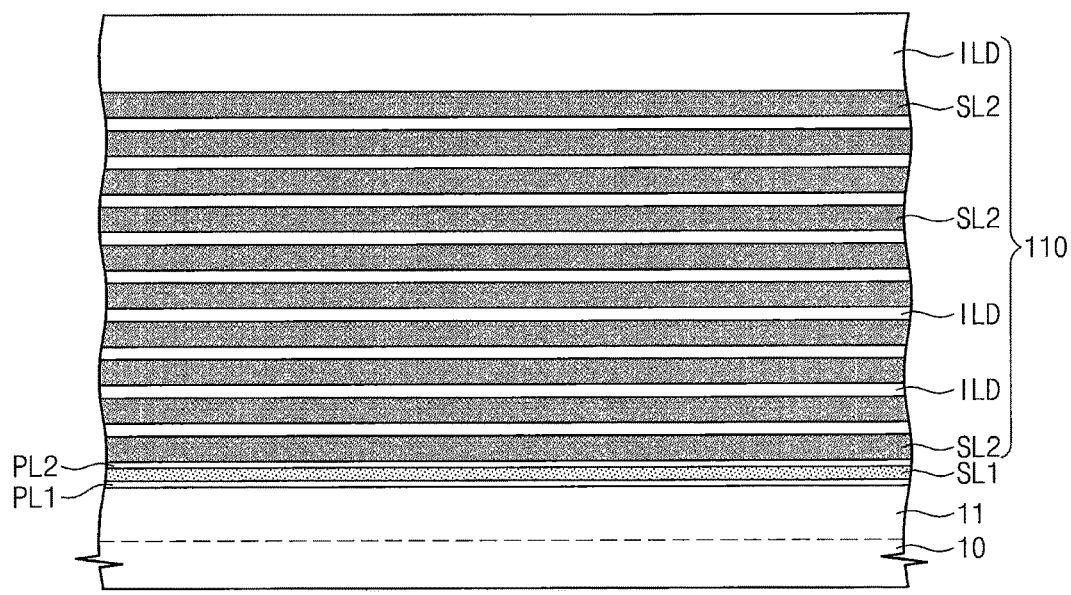
FIGS. 12 through 21 are sectional views taken along line I-I' of FIG. 3 to illustrate a method of fabricating a 3D semiconductor memory device, according to some embodiments of the inventive concepts.

Referring to FIGS. 3 and 12, a first sacrificial layer SL1 may be formed on the substrate 10, and then, a layered structure 110, in which second sacrificial layers SL2 and insulating layers ILD are alternatingly stacked, may be formed on the first sacrificial layer SL1. Furthermore, a first protection layer PL1 may be formed between the first sacrificial layer SL1 and the substrate 10, and a second protection layer PL2 may be formed between the first sacrificial layer SL1 and the lowermost one of the second sacrificial layers SL2.

In some embodiments, the substrate 10 may be formed of a semiconductor material and may be, for example, a bulk silicon wafer, a silicon-on-insulator (SOI) wafer, a germanium wafer, a germanium-on-insulator wafer, a silicon-germanium substrate, or a substrate with an epitaxial layer formed by a selective epitaxial growth (SEG) process. As an example, the substrate 10 may include the well impurity layer 11, which is doped to have a first conductivity type, the and first sacrificial layer SL1 may be formed on a top surface of the well impurity layer 11.

The first sacrificial layer SL1 may be formed of a material having an etch selectivity with respect to the substrate 10, the insulating layers ILD, and the second sacrificial layers SL2. The first sacrificial layer SL1 may be formed of or include at least one of, for example, a poly-silicon layer, a silicon oxide layer, a silicon carbide layer, a silicon germanium layer, a silicon oxynitride layer, or a silicon nitride layer. In some embodiments, the first sacrificial layer SL1 may be thinner than the second sacrificial layer SL2, and a thickness of the first sacrificial layer SL1 may be changed depending on that of a data storing layer that will be formed in a subsequent process.

In the layered structure 110, the second sacrificial layers SL2 may be formed of a material having an etch selectivity with respect to the first sacrificial layer SL1 and the insulating layers ILD. For example, the second sacrificial layers SL2 and the insulating layers ILD may be selected in such a way that they are etched to have a high etch selectivity in a wet etching process using chemical solution and a low etch selectivity in a dry etching process using etching gas. For example, the second sacrificial layers SL2 and the insulating layers ILD may be formed of insulating materials having an etch selectivity with respect to each other. For example, the second sacrificial layers SL2 may be at least one of a silicon layer, a silicon oxide layer, a silicon carbide layer, a silicon germanium layer, a silicon oxynitride layer, or a silicon nitride layer, but it may be formed of a different material from the first sacrificial layer SL1. The insulating layers ILD may be at least one of a silicon layer, a silicon oxide layer, a silicon carbide layer, a silicon oxynitride layer, or a silicon nitride layer, but it may be formed of a different material from the first and second sacrificial layers SL1 and SL2.

As an example, the first sacrificial layer SL1 may be formed of a poly-silicon layer, the second sacrificial layers SL2 may be formed of a silicon nitride layer, and the insulating layers ILD may be formed of a low-k dielectric layer. Alternatively, the first sacrificial layer SL1 may be formed of a silicon nitride layer, the second sacrificial layers SL2 may be formed of a conductive material, and the insulating layers ILD may be formed of a silicon oxide layer.

The first protection layer PL1 may be formed of an insulating material having an etch selectivity with respect to the substrate 10 and the first sacrificial layer SL1. For example, the first protection layer PL1 may include at least one of a silicon oxide layer, a silicon oxynitride layer, or a silicon nitride layer. The second protection layer PL2 may be formed of a material having an etch selectivity with respect to the first sacrificial layer SL1 and the layered structure 110. The second protection layer PL2 may be formed to have a single- or multi-layered structure. For example, the second protection layer PL2 may include at least one of a silicon oxide layer, a silicon oxynitride layer, or a silicon nitride layer. The second protection layer PL2 may be formed of the same material as that of the first protection layer PL1, and the second protection layer PL2 may be formed of a material different from that of the first protection layer PL1. In addition, the first and second protection layers PL1 and PL2 may be formed to be thinner than the first sacrificial layer SL1, the second sacrificial layers SL2, or the insulating layers ILD.

Figure 13:
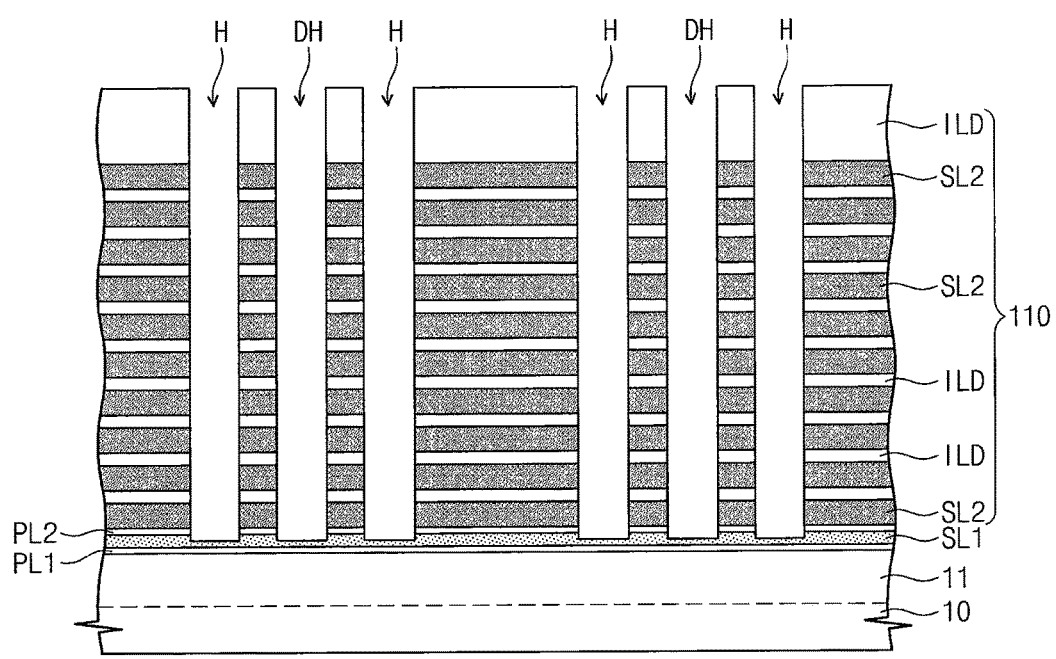

Referring to FIGS. 3 and 13, vertical holes H and DH may be formed to penetrate the layered structure 110 and expose the top surface of the first sacrificial layer SL1.

As an example, the formation of the vertical holes H and DH may include forming a mask pattern on the layered structure 110 and anisotropically etching the layered structure 110 using the mask pattern as an etch mask. In the anisotropic etching process, the second protection layer PL2 may be used as an etch stop layer, and in the case where the anisotropic etching process is performed in the over-etch manner, the top surface of the first sacrificial layer SL1 exposed by the vertical holes H and DH may be recessed to a specific depth. Also, at least one of the vertical holes H and DH may be formed in such a way that a lower width thereof is smaller than an upper width thereof. When viewed in a plan view, the vertical holes H and DH may be formed to have a linear or zigzag arrangement.

The formation of the vertical holes H and DH may include forming the first and second vertical holes H and the dummy vertical holes DH. The first and second vertical holes H may correspond to the first and second vertical structures VS1 and VS2 of FIG. 3, and the dummy vertical holes DH may correspond to the dummy vertical structures DVS. In other words, the first vertical holes may be arranged spaced apart from each other in the first and second directions D1 and D2. The second vertical holes may be arranged spaced apart from each other in the first and second directions D1 and D2 and may be disposed in a diagonal direction with respect to the first vertical holes. In other words, the first and second vertical structures VS1 and VS2 may be disposed to form a zigzag arrangement. The dummy vertical holes DH may be arranged to be spaced apart from each other in the first direction D1. Each of the dummy vertical holes DH may be disposed between a pair of the first vertical holes, which are adjacent to each other in the second direction, and may be disposed in the diagonal direction with respect to the second vertical holes.

Figure 14:
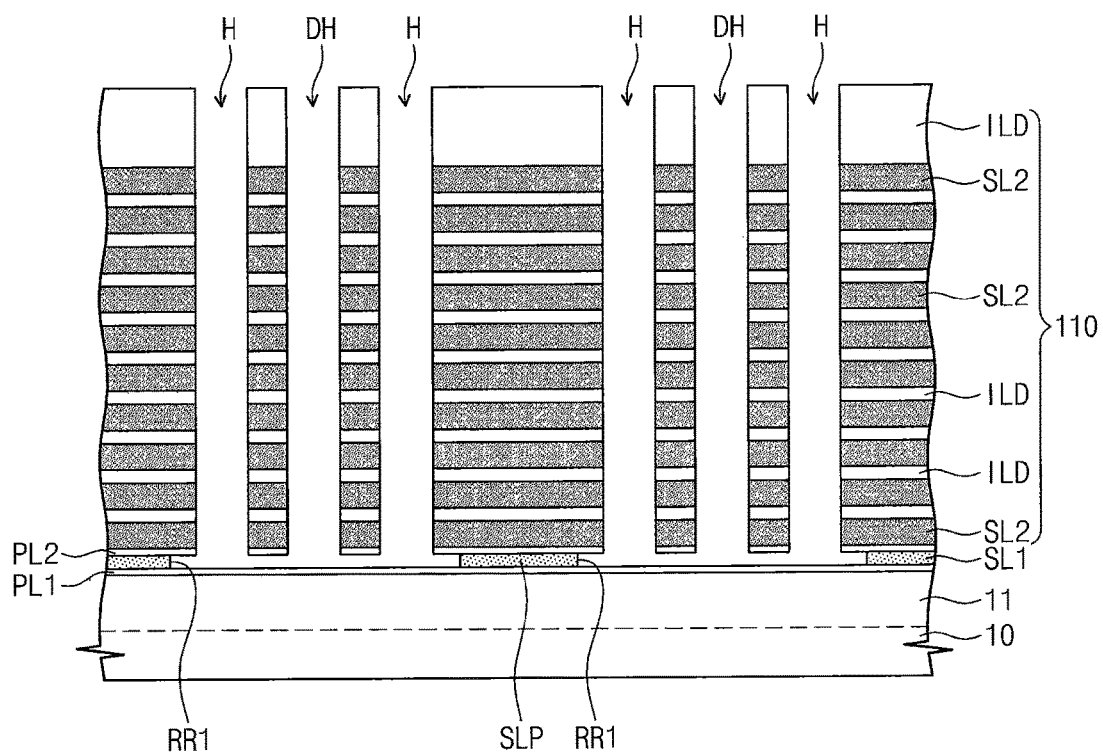

Referring to FIGS. 3 and 14, a portion of the first sacrificial layer SL1 exposed by the vertical holes H and DH may be laterally etched to form a first recess region RR1 below the layered structure 110. The first recess region RR1 may be formed by isotropically etching the first sacrificial layer SL1, using an etch recipe having an etch selectivity with respect to the second sacrificial layers SL2, the insulating layers ILD, and the substrate 10.

The first recess region RR1 may be formed such that a portion of the first sacrificial layer SL1 remains at a region, in which a space between the vertical holes H and DH is large, and thus, a first sacrificial pattern SLP may be formed. The first sacrificial pattern SLP may be disposed between the first recess regions RR1 adjacent to each other in the second direction D2 and may extend in the first direction D1. The first sacrificial pattern SLP may serve as a supporter supporting the layered structure 110.

The first and second protection layers PL1 and PL2 may be used as an etch stop layer in the process of etching the first sacrificial layer SL1. Accordingly, it is possible to prevent the top surface of the substrate 10 and a bottom surface of the lower one of the second sacrificial layers SL2 from being exposed. In other words, the first recess region RR1 may be defined by the top surface of the first protection layer PL1, the bottom surface of the second protection layer PL2, and the sidewall of the first sacrificial pattern SLP. The first recess region RR1 may be connected to the vertical holes H and DH, which are arranged in the first and second directions D1 and D2, and since the isotropic etching process is used to form the first recess region RR1, the first recess region RR1 may have a rounded sidewall.

Figure 15:
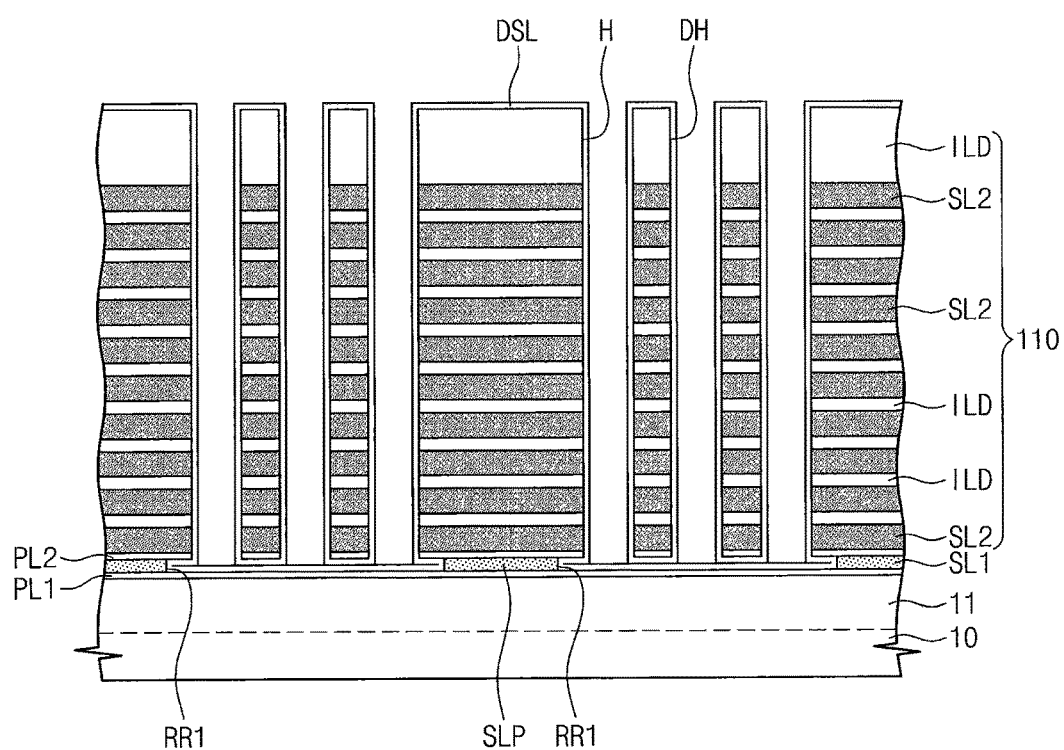

Referring to FIGS. 3 and 15, a data storing layer DSL may be formed to conformally extend on or cover the first recess regions RR1 and the vertical holes H and DH.

The data storing layer DSL may be formed of an insulating material having an etch selectivity with respect to the first and second sacrificial layers SL1 and SL2 and may have a single- or multi-layered structure. For example, the data storing layer DSL may include at least one of layers serving as a memory element of a charge-trap-type nonvolatile memory transistor.

In some embodiments, the data storing layer DSL may be formed by an atomic layer deposition (ALD) process or a chemical vapor deposition (CVD) process. For example, the data storing layer DSL may be formed to have a uniform thickness on inner surfaces of the vertical holes H and DH and the first recess regions RR1. In other words, the data storing layer DSL may be horizontally or laterally extended from the inner surfaces of the vertical holes H and DH into the first recess regions RR1. The data storing layer DSL may be formed to continuously extend on or cover the vertical holes H and DH and the first recess regions RR1. In other words, the data storing layer DSL may be formed on exposed portions of the first and second protection layers PL1 and PL2 (e.g., exposed by the first recess regions RR1). Also, in the first recess regions RR1, the data storing layer DSL may be in contact with the first sacrificial pattern SLP.

In some embodiments, the data storing layer DSL may be formed to have a thickness that is equal to or greater than about half the vertical thickness of the first recess region RR1. Accordingly, the data storing layer DSL may fill the first recess region RR1. Also, since the data storing layer DSL is conformally formed in the first recess region RR1, the data storing layer DSL may extend in the first direction D1, below the layered structure 110.

Figure 16:
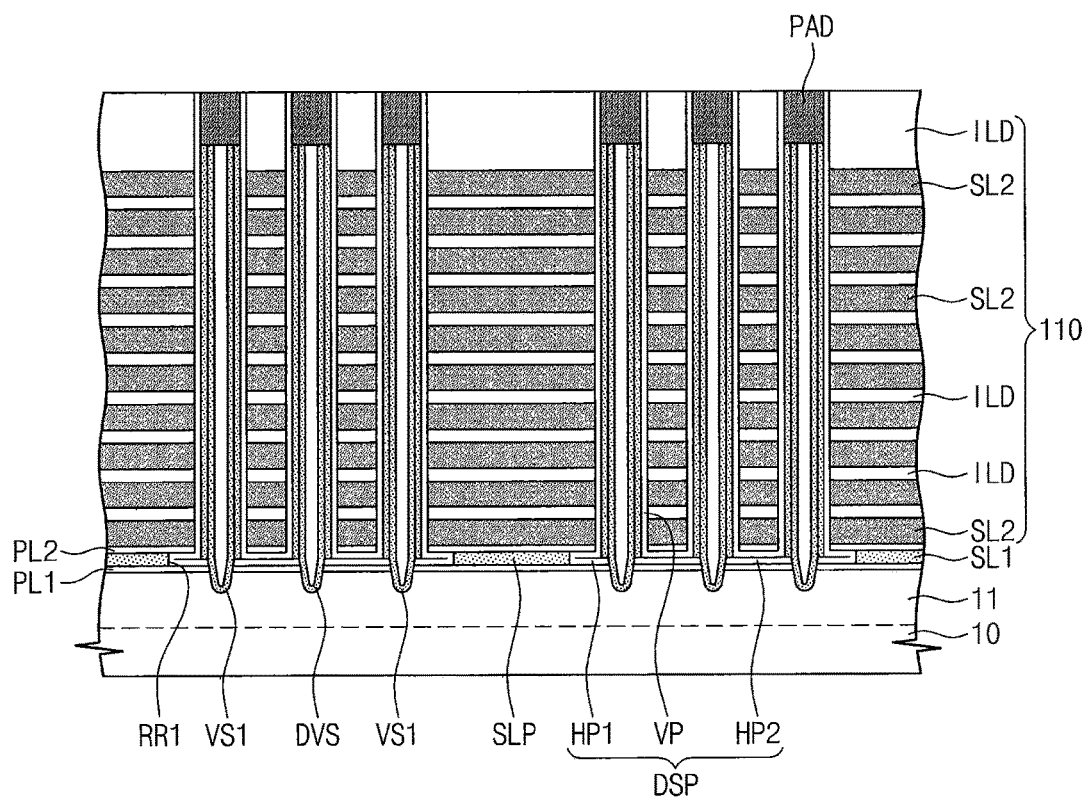

Referring to FIGS. 3 and 16, the vertical structures VS1, VS2, and DVS may be formed to penetrate the layered structure and the data storing layer thereunder. The vertical structures VS1, VS2, and DVS may be connected to the substrate 10.

The formation of the vertical structures VS1, VS2, and DVS may include forming a first semiconductor pattern to extend on or cover an inner wall of each of the vertical holes H and DH provided with the data storing layer DSL and expose the data storing layer DSL, anisotropically etching the data storing layer DSL exposed by the first semiconductor pattern to form a penetration hole exposing the substrate 10, and forming a second semiconductor pattern in the penetration hole to be in contact with the substrate 10. The formation of the vertical structures VS1, VS2, and DVS will be described in more detail with reference to FIGS. 15 through 27.

In some embodiments, the formation of the vertical structures VS1, VS2, and DVS may be performed to partially etch the data storing layer DSL on or covering the top surface of the substrate 10, and as a result, the data storing pattern DSP may be formed in the vertical holes H and DH. As described with reference to FIGS. 3 through 5, the data storing pattern DSP may include a vertical portion on or covering the sidewalls of the second sacrificial layers SL2, a first horizontal or laterally extending portion, which is provided between the substrate 10 and the layered structure 110 to be in contact with the first sacrificial pattern SLP, and a second horizontal or laterally extending portion, which is provided between the substrate 10 and the layered structure 110 and between the vertical structures VS1, VS2, and DVS.

The vertical structures VS1, VS2, and DVS may include the first and second vertical structures VS1 and VS2 and the dummy vertical structures DVS, and first and second vertical structures VS1 and VS2 and the dummy vertical structures DVS may be formed, at substantially the same time, using the same process.

Thereafter, the conductive pads PAD may be formed on the vertical structures VS1, VS2, and DVS. The conductive pads PAD may include doped regions or conductive patterns. In some embodiments, the conductive pads PAD may be positioned at a higher level than that of the topmost surface of the second sacrificial layers SL2.

Figure 17:
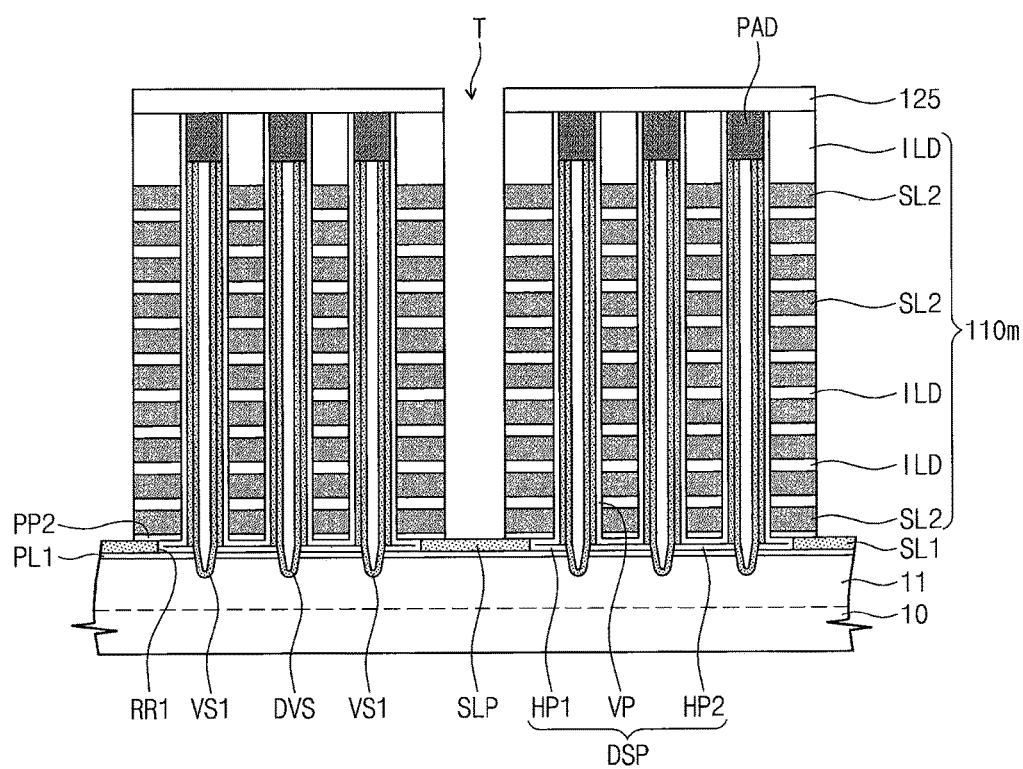

Referring to FIGS. 3 and 17, the layered structure 110 may be patterned to form trenches T exposing the first sacrificial pattern SLP between the vertical structures VS1 and VS2.

For example, the formation of the trenches T may include forming a mask pattern on the layered structure 110 to define positions of the trenches T, and then, anisotropically etching the layered structure 110 using the mask pattern as an etch mask.

The trenches T may be formed spaced apart from the vertical structures and be formed to expose sidewalls of the second sacrificial layers SL2 and the insulating layers ILD. The trenches T may be formed to have a linear or rectangular shape extending in the first direction D1, when viewed in a plan view, and also, the trenches T may be formed to expose the top surface of the first sacrificial pattern SLP. The formation of the trenches T may be performed in an over-etching manner, and thus, the top surface of the first sacrificial pattern SLP exposed by the trenches T may be partially recessed. In some embodiments, although the anisotropic etching process is used to form the trenches T, the trenches T may be formed to have an inclined or curved sidewall.

In some embodiments, before the patterning of the layered structure 110, a capping insulating layer may be formed to extend on or cover the top surfaces of the conductive pads PAD, and during the formation of the trenches T, the capping insulating layer may be patterned to form the capping insulating pattern 125 on or covering the vertical structures VS1, VS2, and DVS. As a result of the formation of the trenches T, the layered structure 110 may be divided into a plurality of mold structures 110m. The mold structures 110m may have a linear shape extending in the first direction D1 and may be spaced apart from each other in the second direction D2. In some embodiments, a portion of the first sacrificial pattern SLP between the mold structures 110m may be exposed by the trench T. Furthermore, during the formation of the trenches T, the second protection layer may be etched to form the second protection insulating pattern PP2 on the bottom surface of the lowermost one of the insulating layers ILD.

Figure 18:
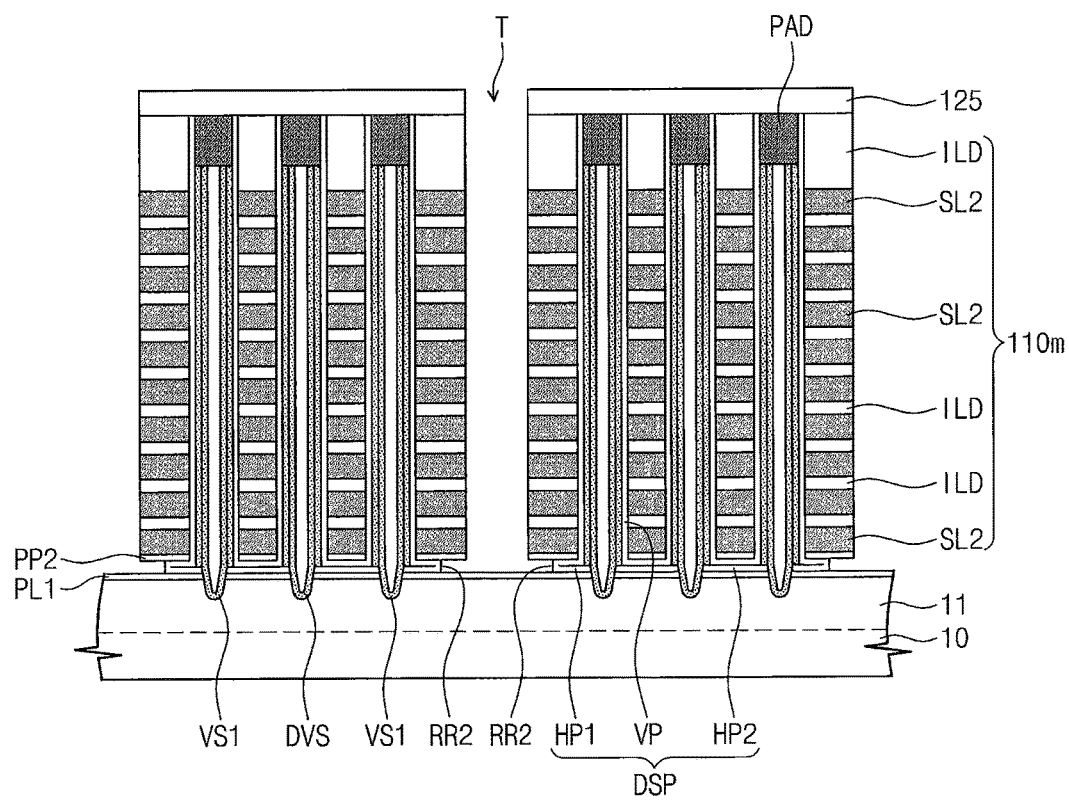

Referring to FIGS. 3 and 18, the first sacrificial pattern SLP exposed by the trench T may be removed to form a second recess region RR2 below the mold structures 110m, and the second recess region RR2 may be formed to partially expose the data storing pattern DSP. The second recess region RR2 may be formed by isotropically etching the first sacrificial pattern SLP using an etch recipe having an etch selectivity with respect to the second sacrificial layers SL2, the insulating layers ILD, and the substrate 10.

The second protection insulating pattern PP2 may prevent the lowermost one of the second sacrificial layers SL2 from being etched by the isotropic etching process for forming the second recess region RR2. Accordingly, during the formation of the second recess region RR2, it is possible to reduce the variation in thickness of the lowermost one of the second sacrificial layers SL2. Also, the first protection layer PL1 may prevent the substrate 10 from being exposed by the isotropic etching process for forming the second recess region RR2.

Figure 19:
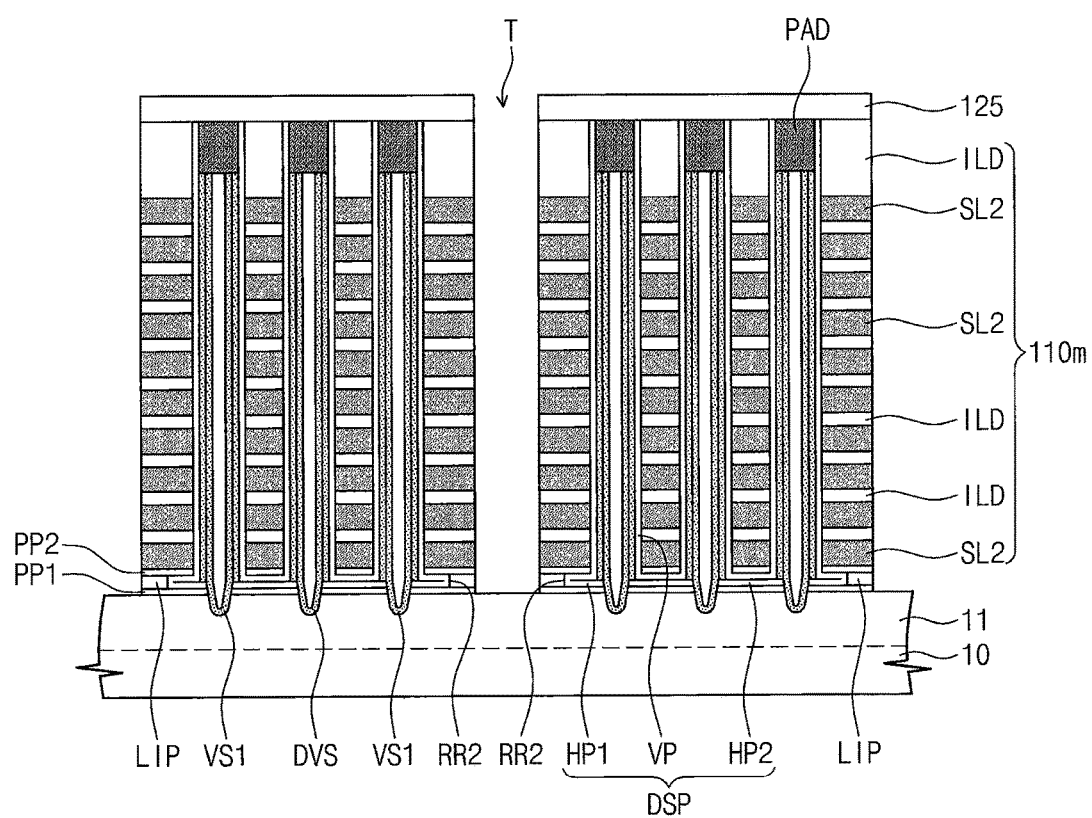

Referring to FIGS. 3 and 19, the lower insulating patterns LIP may be formed to fill the second recess region RR2. The lower insulating pattern LIP may be in contact with the data storing pattern DSP, in the second recess region RR2.

The formation of the lower insulating patterns LIP may include depositing the a lower insulating layer in the trench T and the second recess region RR2 and removing the lower insulating layer from the trench T to expose the sidewalls of the mold structures 110m and the first protection layer PL1. The lower insulating patterns LIP may be aligned to the sidewalls of the mold structures 110m. During the formation of the lower insulating patterns LIP, the first protection layer PL1 exposed by the lower insulating patterns LIP may be anisotropically etched to form the first protection insulating pattern PP2, and the substrate 10 may be partially exposed between the mold structures 110m.

Figure 20:
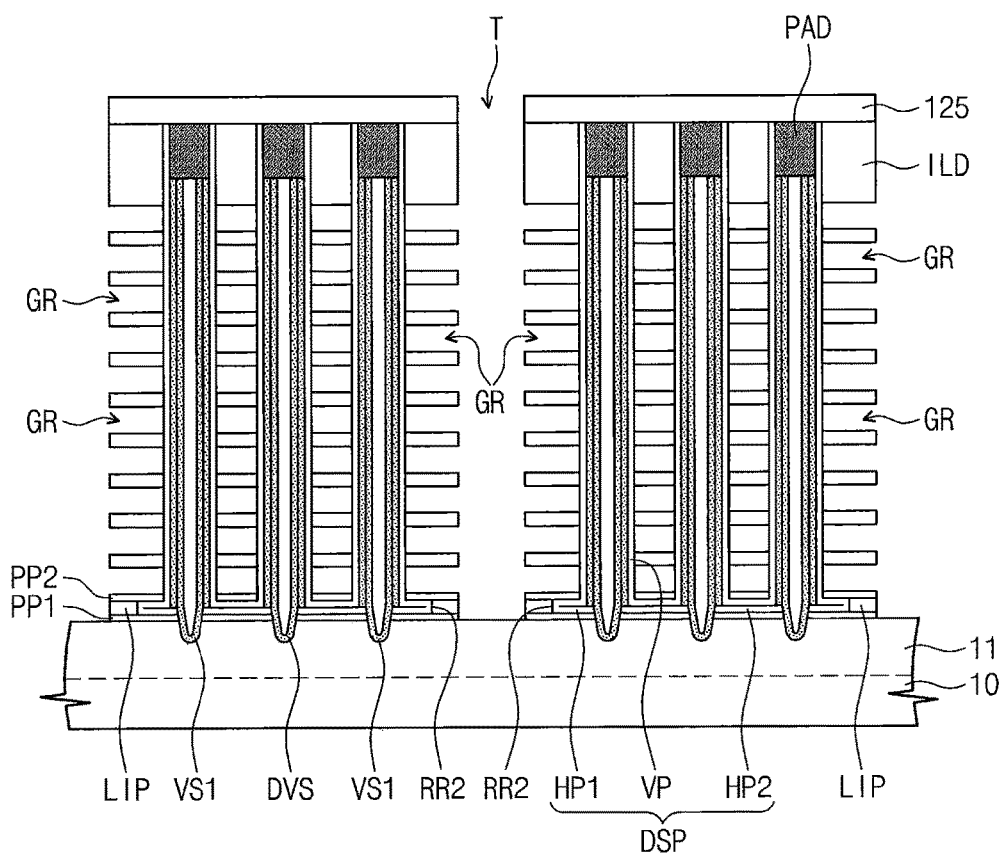

Referring to FIGS. 3 and 20, the second sacrificial layers SL2 exposed by the trenches T may be removed to form gate regions GR between the insulating layers ILD.

The formation of the gate regions GR may include isotropically etching the second sacrificial layers SL2 using an etch recipe having an etch selectivity with respect to the insulating layers ILD, the vertical structures VS1 and VS2, the dummy vertical structures DVS, the data storing pattern DSP, and the lower insulating patterns LIP. Here, the second sacrificial layers SL2 may be fully removed by the isotropic etching process. For example, in the case where the second sacrificial layers SL2 are formed of a silicon nitride layer and the insulating layers ILD are formed of a silicon oxide layer, the etching step may be performed by an isotropic etching process using an etching solution containing phosphoric acid. Furthermore, the data storing pattern DSP may be used as an etch stop layer in the isotropic etching process for forming the gate regions GR. As a result, the gate regions GR may be positioned between the insulating layers ILD and may expose portions of the sidewall of the data storing pattern DSP or portions of the sidewalls of the vertical structures VS1 and VS2. In other words, each of the gate regions GR may be defined by vertically adjacent ones of the insulating layers ILD and the sidewall of the data storing pattern DSP.

Figure 21:
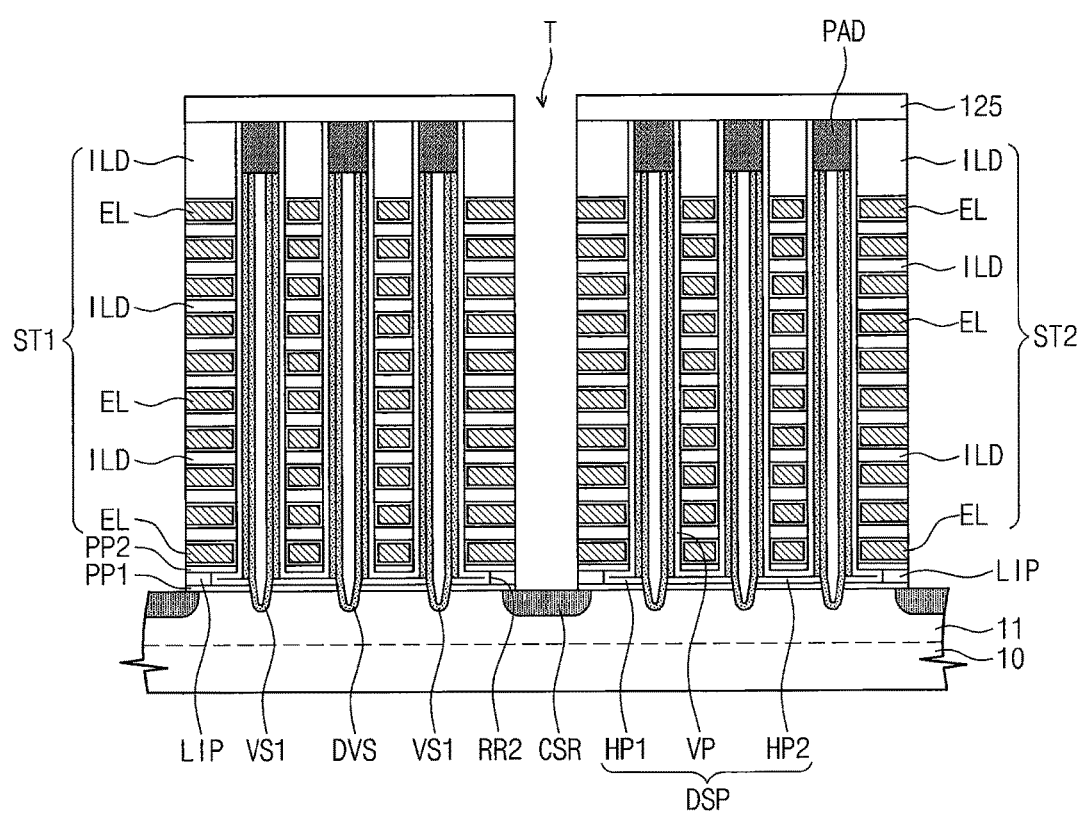

Referring to FIGS. 3 and 21, the horizontal insulating pattern HIL (shown in greater detail in FIG. 5) may be formed to conformally extend on or cover inner surfaces of the gate regions GR. For example, the horizontal insulating pattern HIL may be formed to have a substantially uniform thickness on the inner surfaces of the gate regions GR. The horizontal insulating pattern HIL may be formed to have a single- or multi-layered structure. In a charge-trap type FLASH memory device, the horizontal insulating pattern HIL may serve as a part of a data storing element of a memory transistor.

Thereafter, the electrodes EL may be formed in the gate regions GR provided with the horizontal insulating pattern HIL. The electrodes EL may be formed to partially or wholly fill the gate regions GR. In some embodiments, the formation of the electrodes EL may include sequentially depositing a barrier metal layer and a metal layer. The barrier metal layer may be formed of or include one or more metal nitride materials (e.g., TiN, TaN, or WN). The metal layer may be formed of or include one or more metallic materials (e.g., W, Al, Ti, Ta, Co, or Cu). In addition, the metal layer may be removed from the trench T, and thus, the electrodes EL may be formed in the gate regions GR, respectively.

As a result, the insulating layers ILD and the electrodes EL may be alternatingly stacked on the substrate 10 to form the first and second stacks ST1 and ST2. The first and second stacks ST1 and ST2 may extend in the first direction D1 and have the sidewalls exposed by the trench T.

Next, the common source regions CSR may be formed in the substrate 10 between the first and second stacks ST1 and ST2. The common source regions CSR may be formed to be parallel to each other or in the first direction D1 and may be spaced apart from each other in the second direction D2. The common source region CSR may be doped to have a different conductivity type from that of the substrate 10. In some embodiments, the common source region CSR may be formed to include a portion positioned below the lower insulating pattern LIP.

Referring to FIGS. 3 and 4, the sidewall insulating spacer SSP may be formed to extend on or cover the sidewalls of the trenches T. The formation of the sidewall insulating spacer SSP may include depositing a spacer layer on the substrate 10 provided with the first and second stacks ST1 and ST2 to have a uniform thickness and then performing an etch-back process on the spacer layer to expose the common source region CSR. Here, the spacer layer may be formed of an insulating material and may have a thickness, which is smaller than about half the minimum width of the trench T, on the inner surfaces of the trenches T. The spacer layer may be formed of or include at least one of silicon oxide, silicon nitride, silicon oxynitride, or low-k dielectric materials.

After the formation of the sidewall insulating spacer SSP, the common source plug CSP may be formed to be in contact with the common source region CSR. The common source plug CSP may be formed to fill the trench T provided with the sidewall insulating spacer SSP. The formation of the common source plug CSP may include depositing a conductive layer in the trench T and then performing a planarization process on the conductive layer to expose the top surface of the capping insulating pattern 125.

Thereafter, the first insulating layer 130 may be formed to extend on or cover the first and second stacks ST1 and ST2 and the common source plug CSP, and the lower contact plugs LCP may be formed to pass through the first insulating layer 130 and be connected to the vertical structures VS1 and VS2. Next, the first to fourth subsidiary lines SBL1-SBL4 may be formed on the first insulating layer 130 to be connected to the lower contact plugs LCP. The second insulating layer 140 may be formed on the first insulating layer 130, and the upper contact plugs UCP may be formed to pass through the second insulating layer 140 and be connected to the first to fourth subsidiary lines SBL1-SBL4.

The first and second bit lines BL1 and BL2 may be formed on the second insulating layer 140 to be connected to the upper contact plugs UCP.

Hereinafter, a method of forming the vertical structure of the 3D semiconductor memory device of FIG. 4 will be described with reference to FIGS. 22 through 30. FIGS. 22 through 30 are enlarged sectional views illustrating a method of forming a vertical structure (e.g., a portion 'A' of FIG. 4) of a 3D semiconductor memory device, according to some embodiments of the inventive concepts. For concise description, an element previously described with reference to FIGS. 12 through 21 may be identified by a similar or identical reference number without repeating an overlapping description thereof.

Figure 22:
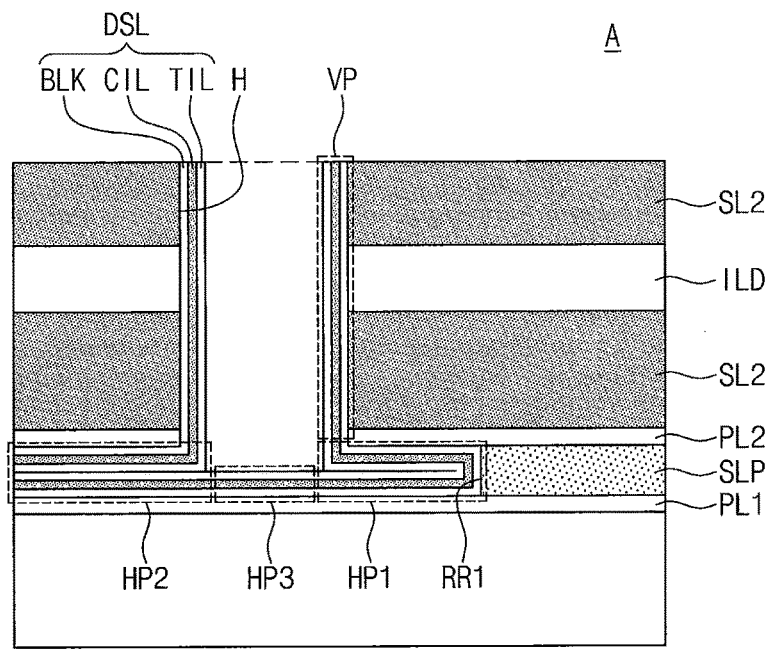
FIGS. 22 through 30 are enlarged sectional views illustrating a method of forming a vertical structure (e.g., a portion 'A' of FIG. 4) of a 3D semiconductor memory device, according to some embodiments of the inventive concepts.

Referring to FIG. 22, in conjunction with FIG. 6, the vertical holes H may be formed to penetrate the second sacrificial layers SL2 and the insulating layers ILD, the first recess region RR1 may be formed below the second sacrificial layers SL2, and the data storing layer DSL may be formed to conformally extend on or cover inner surfaces of the vertical holes H and the first recess region RR1. In some embodiments, the formation of the data storing layer DSL may include sequentially depositing a blocking insulating layer, a charge storing layer, and a tunnel insulating layer.

The data storing layer DSL may be formed to have a thickness that is smaller than about half the width of the vertical holes H. The data storing layer DSL may continuously extend from the side surfaces of the vertical holes H and may be formed with a uniform thickness on the top surface of the first protection layer PL1 and the bottom surface of the second protection layer PL2.

The data storing layer DSL may continuously extend from the side surface of the vertical hole H in such a way that it has a folded structure in the first recess region RR1. In certain embodiments, the first recess region RR1 may be filled with the data storing layer DSL.

In detail, the data storing layer DSL may include the vertical portion VP on or covering the side surfaces of the vertical holes H, the first horizontal or laterally extending portion HP1, which is continuously extended from the vertical portion VP to be in contact with the first sacrificial pattern SLP, the second horizontal or laterally extending portion HP2, which is continuously extended from the vertical portion VP and is formed between adjacent ones of the vertical holes H, and a third horizontal or laterally extending portion HP3, which is provided below the vertical holes H to connect the first horizontal or laterally extending portion HP1 to the second horizontal or laterally extending portion HP2. Here, a thickness of the third horizontal or laterally extending portion HP3 may have substantially the same thickness as that of the vertical portion VP, and thicknesses of the first and second horizontal or laterally extending portions HP1 and HP2 may be greater than about two times the thickness of the vertical portion VP.

Figure 26:
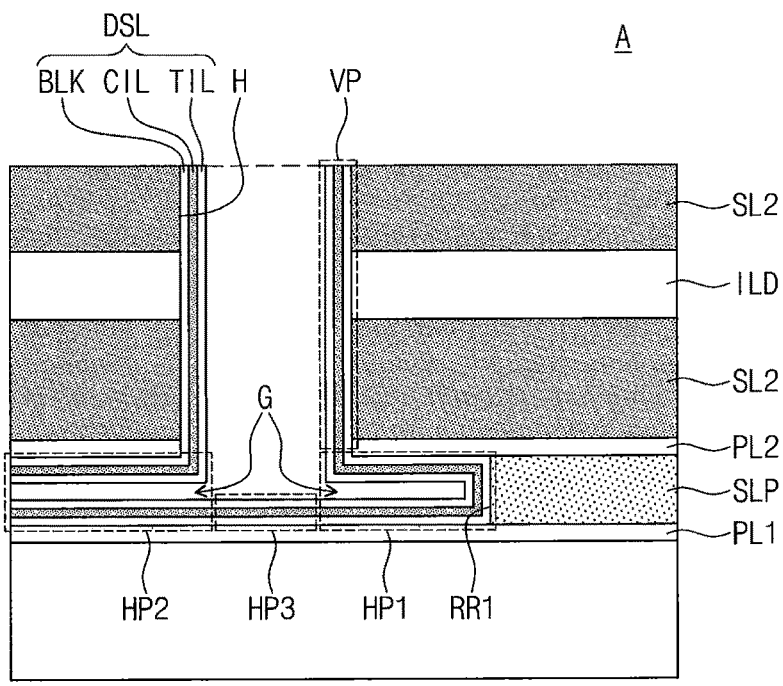

In certain embodiments, as shown in FIG. 26, the data storing layer DSL may be vertically spaced apart from each other in the first recess region RR1 to define a gap region G in the first recess region. RR1. In other words, the gap region G may be provided between the first protection layer PL1 and the second protection layer PL2, and each of the first and second horizontal or laterally extending portions HP1 and HP2 of the data storing layer DSL positioned below the second sacrificial layers SL2 may be formed to have the gap region G.

Figure 23:
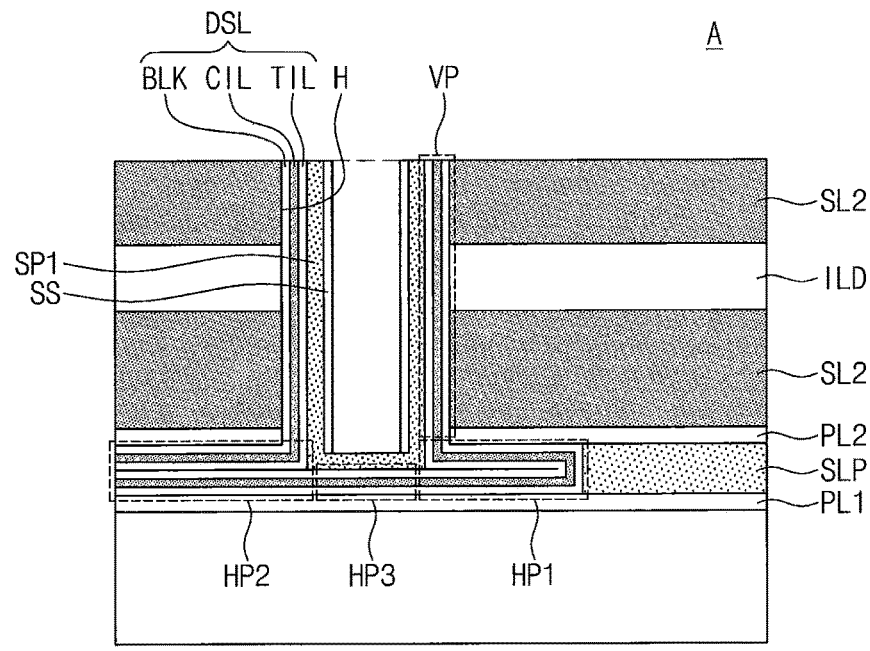

Referring to FIG. 23, the first semiconductor layer SP1 may be formed to conformally extend on or cover the data storing layer DSL. The first semiconductor layer SP1 may be formed to have the same thickness on the vertical portion VP and the third horizontal or laterally extending portion HP3 of the data storing layer DSL and to partially fill the vertical hole H. The first semiconductor layer SP1 may be a semiconductor material (e.g., poly silicon, single crystalline silicon, or amorphous silicon), which is formed by one of atomic layer deposition (ALD) or chemical vapor deposition (CVD) processes.

Thereafter, a sacrificial spacer SS may be formed in the vertical hole H to extend on or cover a side surface of the first semiconductor layer SP1 and to expose a portion of the first semiconductor layer SP1. In certain embodiments, the formation of the sacrificial spacer SS may be omitted. The sacrificial spacer SS may be formed of a material having an etch selectivity with respect to the first semiconductor layer SP1. For example, the sacrificial spacer SS may be a silicon oxide layer or a silicon nitride layer, which is formed by an atomic layer deposition process.

The formation of the sacrificial spacer SS may include conformally depositing a sacrificial spacer layer on the first semiconductor layer SP1 and performing an etch back process on the sacrificial spacer layer to expose the first semiconductor layer SP1 below the vertical hole H. For example, the sacrificial spacer SS may be formed to partially expose the first semiconductor layer SP1 on the third horizontal or laterally extending portion HP3 of the data storing layer DSL.

Figure 27:
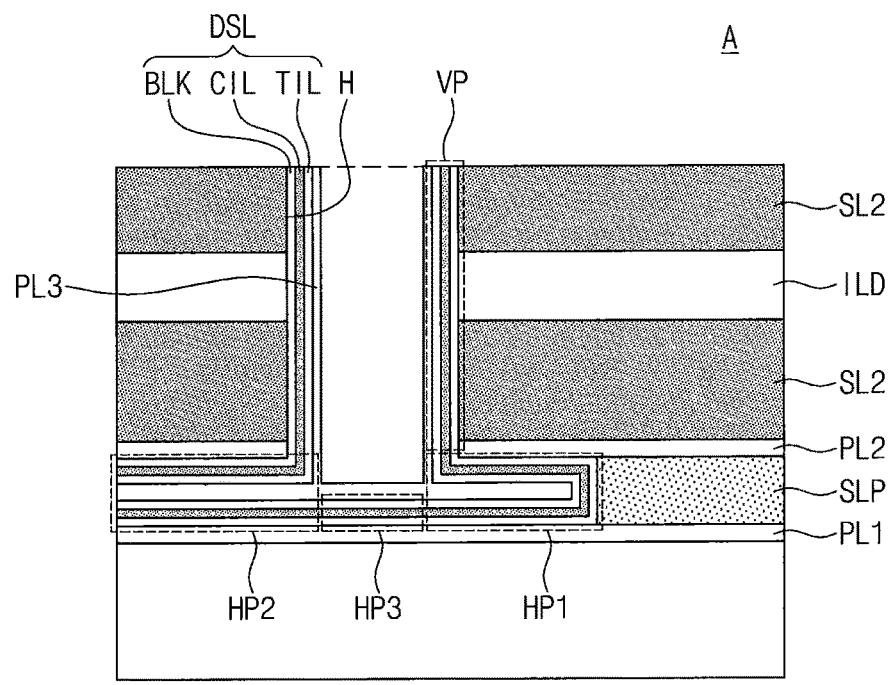

In the case where the data storing layer DSL is formed to define the gap region G in the first recess region RR1, as shown in FIG. 27, a third protection layer PL3 may be formed to fill the gap region G, before the formation of the first semiconductor layer SP1.

Figure 28:
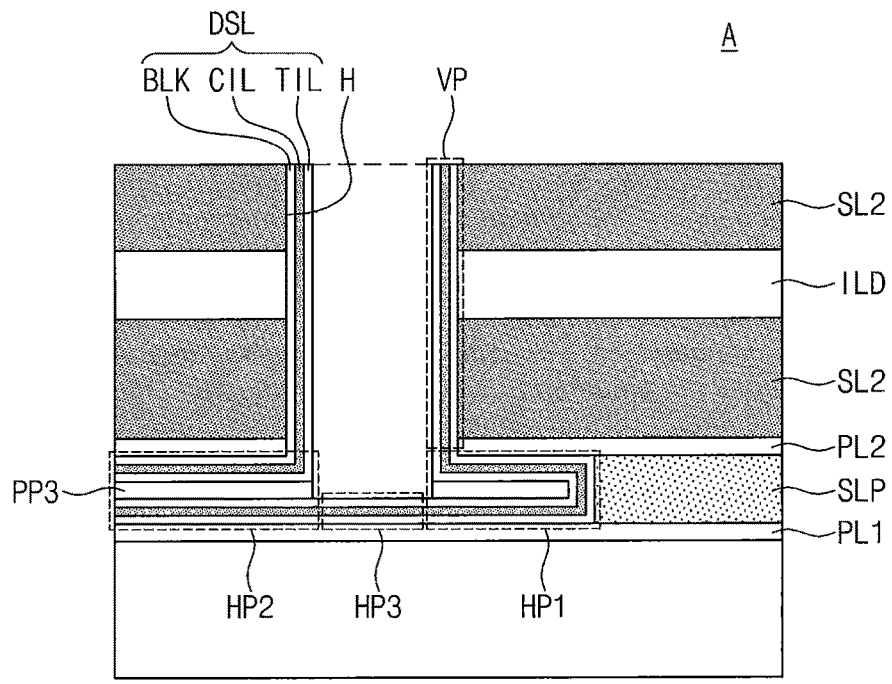

The third protection layer PL3 may be formed to fill the gap region G between the first and second protection layers PL1 and PL2 and to extend on or cover the side surfaces of the vertical holes H provided with the data storing layer DSL. The third protection layer PL3 may be formed of a semiconductor material or an insulating material having an etch selectivity with respect to the data storing layer DSL. Next, the third protection layer PL3 may be etched to expose the data storing layer DSL in the vertical holes H, and thus, a third protection pattern PP3 may be formed between the first and second protection layers PL1 and PL2, as shown in FIG. 28. The third protection pattern PP3 may be formed to expose the third horizontal or laterally extending portion HP3 of the data storing layer DSL.

Figure 24:
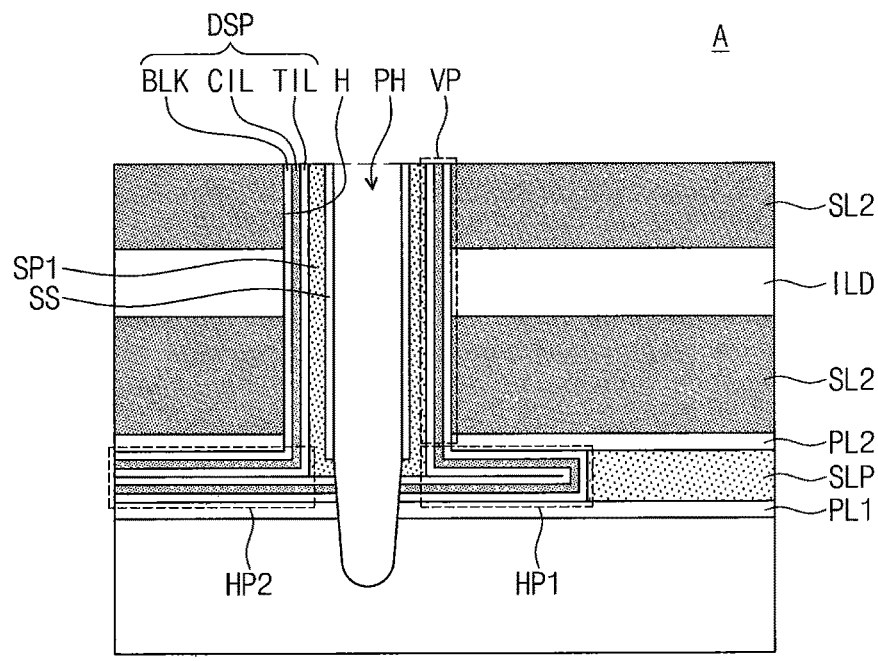

Referring to FIG. 24, the first semiconductor layer exposed by the sacrificial spacer SS may be anisotropically etched to form the first semiconductor pattern SP1. The first semiconductor pattern SP1 may have a hollow cylindrical structure on the data storing layer DSL. Next, the data storing layer DSL and the first protection layer PL1 may be anisotropically etched using the sacrificial spacer SS and the first semiconductor pattern SP1 as an etch mask to form a penetration hole PH exposing the substrate 10. The third horizontal or laterally extending portion HP3 of the data storing layer DSL may be etched during the anisotropic etching process for forming the penetration hole PH, and in certain embodiments, the top surface of the substrate 10 below the third horizontal or laterally extending portion HP3 may be vertically recessed. The data storing pattern DSP may be formed as a result of the formation of the penetration hole PH. In other words, the data storing pattern DSP may include the vertical portion VP on or covering the side surface of the vertical hole H, the first horizontal or laterally extending portion HP1 in contact with the first sacrificial pattern SLP, and the second horizontal or laterally extending portion HP2 between adjacent ones of the vertical holes H. The sacrificial spacer SS may be removed by a process of forming the penetration hole PH or by an additional etching process.

Figure 29:
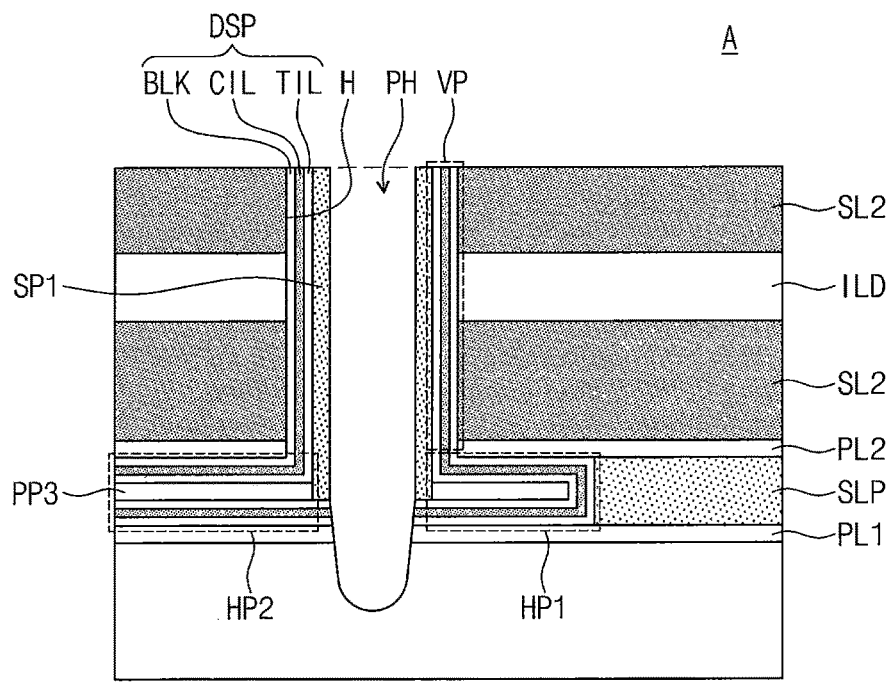

In the case where the third protection pattern PP3 are formed below the second sacrificial layers SL2, the first semiconductor pattern SP1 may be formed on the data storing pattern DSP to extend on or cover the sidewall of the third protection pattern PP3, as shown in FIG. 29.

Figure 25:
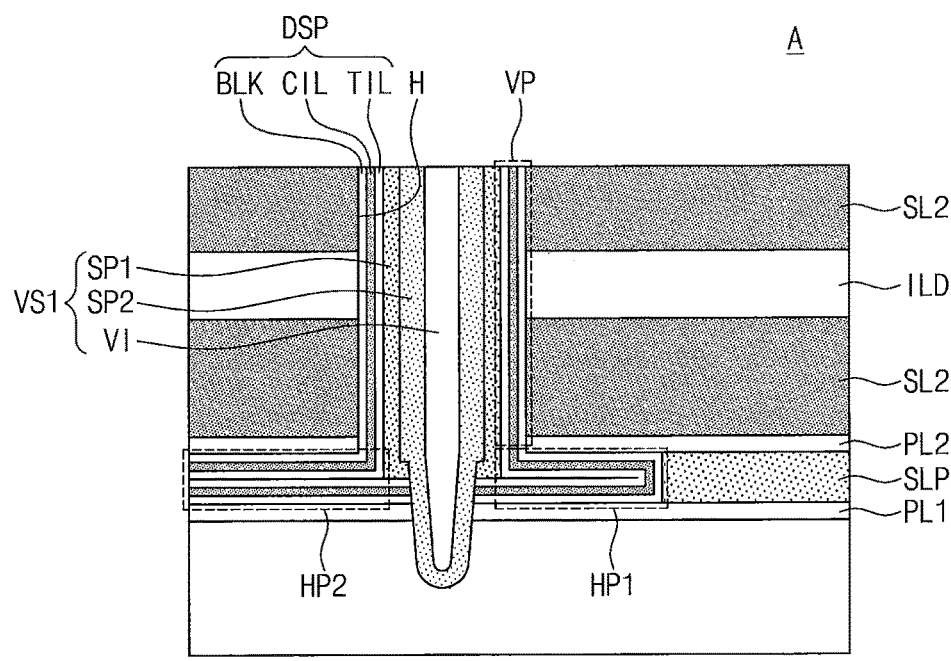
Figure 30:
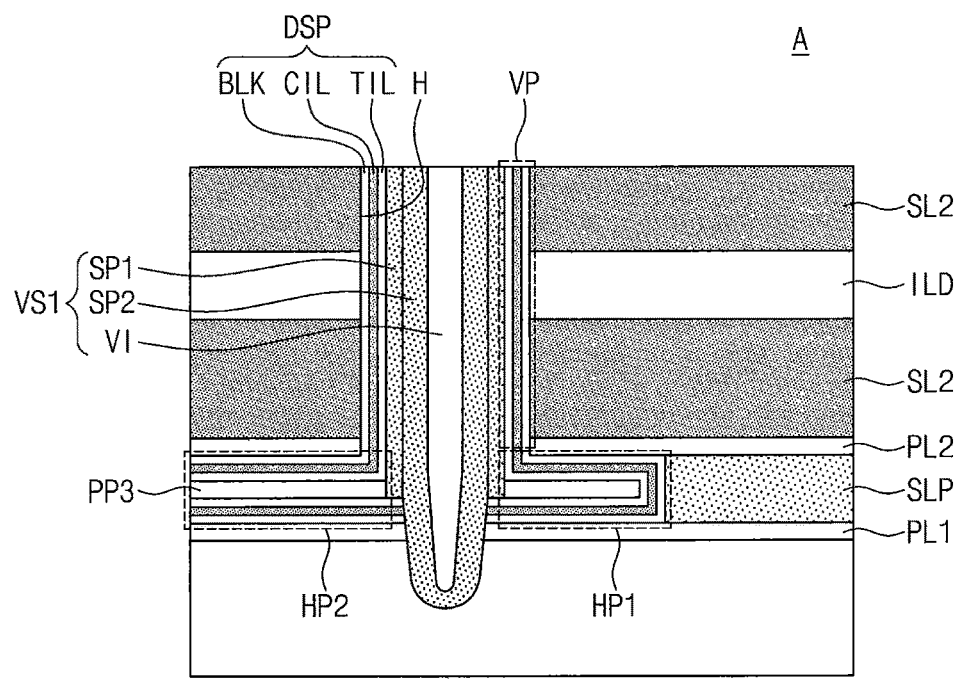

Referring to FIGS. 25 and 30, the second semiconductor pattern SP2 may be formed in the penetration holes PH to connect the substrate 10 to the first semiconductor pattern SP1. The second semiconductor pattern SP2 may be formed of a semiconductor material (e.g., poly silicon), which may be formed by a deposition technique. The second semiconductor pattern SP2 may be formed to partially fill the penetration holes PH, and the insulating gap-fill pattern VI may be formed to fill the inner space of the second semiconductor pattern SP2. The second semiconductor pattern SP2 may be in direct contact with the substrate 10 and may be in contact with portions of the first and second horizontal or laterally extending portions HP1 and HP2 of the data storing pattern DSP.

Figure 31:
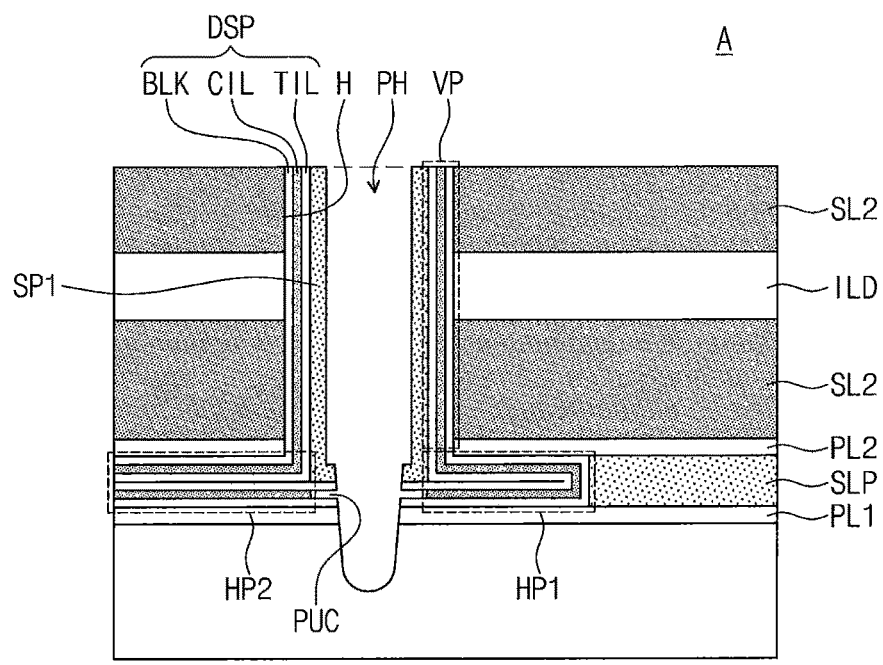
FIGS. 31 through 33 are enlarged sectional views illustrating a method of forming a vertical structure (e.g., a portion 'A' of FIG. 6) of a 3D semiconductor memory device, according to some embodiments of the inventive concepts.
Figure 32:
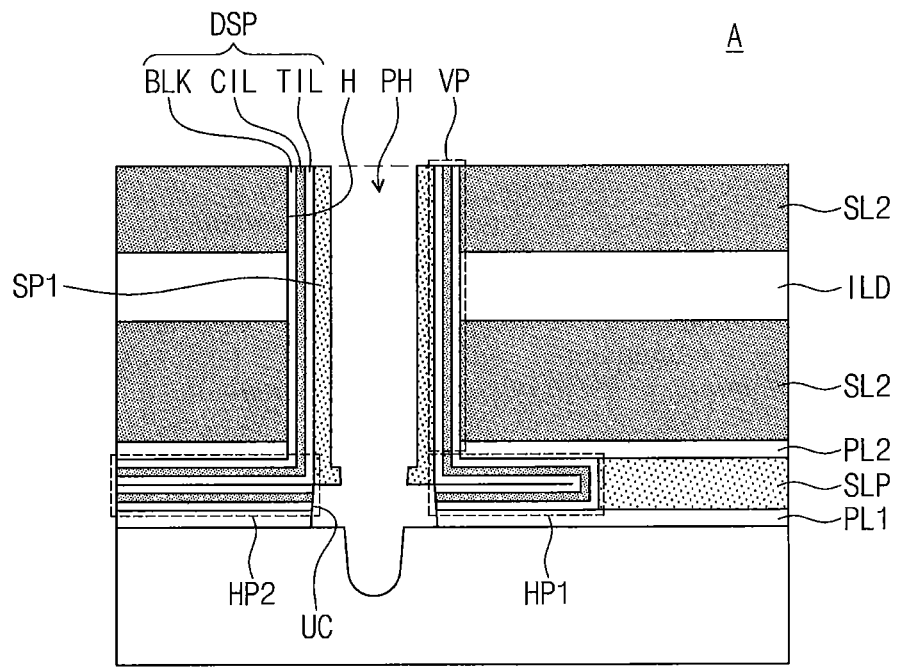
Figure 33:
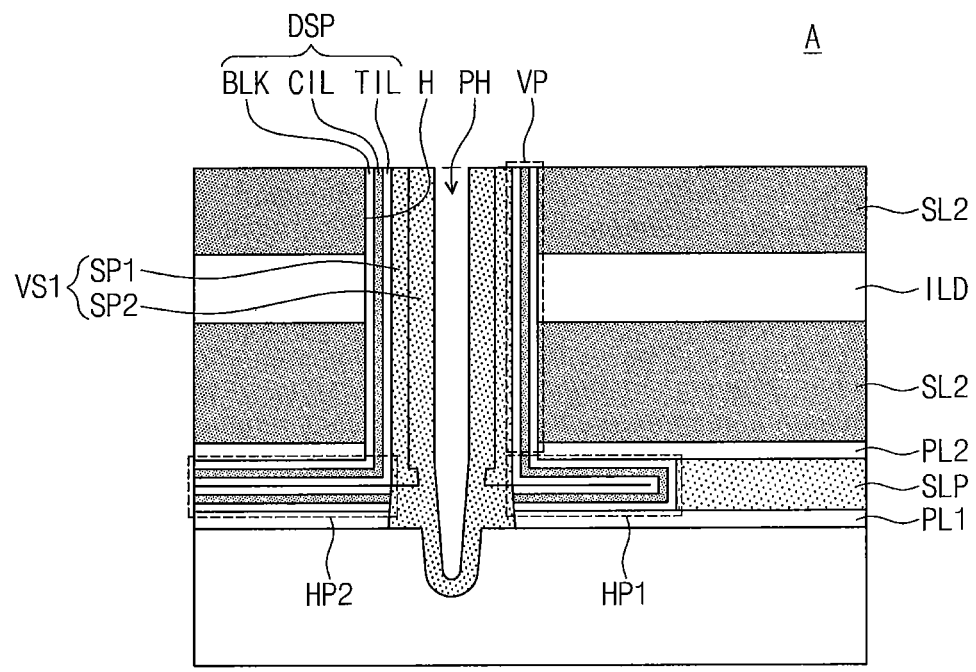

Hereinafter, a method of forming the vertical structure of the 3D semiconductor memory device of FIG. 6 will be described with reference to FIGS. 31 through 33. FIGS. 31 through 33 are enlarged sectional views illustrating a method of forming a vertical structure (e.g., a portion 'A' of FIG. 6) of a 3D semiconductor memory device, according to some embodiments of the inventive concepts.

Referring to FIG. 31 along with FIG. 24, the data storing pattern DSP exposed by the first semiconductor pattern SP1 may be partially removed to form a preliminary undercut region PUC under the first semiconductor pattern SP1. The preliminary undercut region PUC may be horizontally or laterally extended from the penetration hole PH.

In the case where the data storing pattern DSP includes the blocking insulating layer BLK, the charge storing layer CIL, and the tunnel insulating layer TIL, the preliminary undercut region PUC may be formed by laterally etching a portion of the charge storing layer CIL. For example, when the charge storing layer CIL is formed of a silicon nitride layer, the preliminary undercut region PUC may be formed by a wet etching process using an etching solution containing phosphoric acid. Alternatively, the preliminary undercut region PUC may be formed by laterally etching the blocking insulating layer BLK and the tunnel insulating layer TIL.

Referring to FIG. 32, a portion of the data storing pattern DSP and a portion of the first protection layer PL1 exposed by the preliminary undercut region PUC may be removed to form the under-cut region UC exposing the bottom surface of the first semiconductor pattern SP1 and a portion of the substrate 10. The under-cut region UC may be horizontally or laterally extended from the penetration hole PH.

The under-cut region UC may be formed using at least one of a wet etching process or an isotropic dry etching process. When the wet etching process is used to form the under-cut region UC, an etching solution containing hydrofluoric acid or sulfuric acid may be used.

Referring to FIG. 33, the second semiconductor pattern SP2 may be formed in the penetration hole PH to fill the under-cut region UC. The second semiconductor pattern SP2 may be formed to connect the first semiconductor pattern SP1 to the substrate 10, and in some embodiments, the second semiconductor pattern SP2 may be formed to be in contact with a bottom surface of the first semiconductor pattern SP1.

The second semiconductor pattern SP2 may be formed of a semiconductor material (e.g., poly silicon), which may be formed by a deposition technique. The second semiconductor pattern SP2 may be formed to partially fill the penetration holes PH, and the insulating gap-fill pattern VI may be formed to fill an inner space of the second semiconductor pattern SP2.

According to some embodiments of the inventive concepts, a data storing layer may extend from a sidewall of a stack to a bottom surface of the stack. However, since the data storing layer is spaced apart from a substrate, it is possible to easily establish an electric connection between vertical structures and the substrate.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional (3D) semiconductor memory device, comprising:
    a stack comprising electrodes vertically stacked on a substrate;
    lower insulating patterns interposed between the stack and the substrate, the lower insulating patterns being adjacent to both sidewalls of the stack and being horizontally spaced apart from each other;
    a plurality of vertical structures penetrating the stack and being connected to the substrate; and
    a data storing pattern between the stack and the vertical structures, the data storing pattern including a portion that is disposed between a lowermost one of the electrodes and the substrate and laterally extends to contact the lower insulating patterns.

2. The 3D semiconductor memory device of claim 1, wherein the vertical structures are disposed between the lower insulating patterns and are spaced apart from each other.

3. The 3D semiconductor memory device of claim 1, wherein the stack and the lower insulating patterns extend parallel to each other.

4. The 3D semiconductor memory device of claim 1, wherein a thickness of the lower insulating patterns is greater than that of the data storing pattern and smaller than that of the electrodes.

5. The 3D semiconductor memory device of claim 1, further comprising:
    a first protection insulating pattern between the substrate and the lower insulating patterns; and
    a second protection insulating pattern between the lowermost one of the electrodes and the lower insulating patterns.

6. The 3D semiconductor memory device of claim 1, wherein the data storing pattern comprises a vertical portion interposed between the stack and the vertical structures, and the portion comprises a first horizontal portion interposed between the substrate and the stack to contact the lower insulating patterns, and a second horizontal portion interposed between the substrate and the stack and between adjacent ones of the vertical structures.

7. The 3D semiconductor memory device of claim 1, wherein each of the vertical structures comprises:
    a first semiconductor pattern on a sidewall of the data storing pattern; and
    a second semiconductor pattern in direct contact with the substrate, thereby connecting the first semiconductor pattern to the substrate, wherein a portion of a sidewall of the second semiconductor pattern is in contact with the data storing pattern.

8. The 3D semiconductor memory device of claim 7, wherein the second semiconductor pattern comprises a portion that horizontally extends to contact a bottom surface of the first semiconductor pattern.

9. A three-dimensional (3D) semiconductor memory device, comprising:
a pair of lower insulating patterns disposed on a substrate to be spaced apart from each other and extend in a first direction;
a stack on the pair of lower insulating patterns, the stack comprising electrodes vertically stacked on the substrate and extending in the first direction;
a plurality of vertical structures penetrating the stack and being connected to the substrate; and
a data storing pattern enclosing sidewalls of the vertical structures,
wherein the data storing pattern laterally extends to face a bottom surface of a lowermost one of the electrodes and to contact the lower insulating patterns.

10. The 3D semiconductor memory device of claim 9, wherein the data storing pattern comprises a vertical portion interposed between the stack and the vertical structures, a first horizontal portion interposed between the substrate and the stack to contact the lower insulating patterns, and a second horizontal portion interposed between the substrate and the stack and between adjacent ones of the vertical structures.

11. The 3D semiconductor memory device of claim 9, wherein the data storing pattern is spaced apart from the substrate.

12. The 3D semiconductor memory device of claim 9, wherein each of the vertical structures comprises:
a first semiconductor pattern on a sidewall of the data storing pattern; and
a second semiconductor pattern in contact with the substrate and connecting the first semiconductor pattern to the substrate,
wherein a portion of a sidewall of the second semiconductor pattern is in contact with the data storing pattern.

13. The 3D semiconductor memory device of claim 12, wherein the second semiconductor pattern comprises a portion that horizontally extends to contact a bottom surface of the first semiconductor pattern.

14. The 3D semiconductor memory device of claim 9, further comprising:
a first protection insulating pattern interposed between the substrate and the lower insulating patterns; and
a second protection insulating pattern interposed between the lowermost one of the electrodes and the lower insulating patterns.

15. The 3D semiconductor memory device of claim 14, wherein:
the first protection insulating pattern horizontally extends to contact the vertical structures between the data storing pattern and the substrate; and
the second protection insulating pattern horizontally extends between the lowermost one of the electrodes and the data storing pattern.

16. A three-dimensional semiconductor memory device, comprising:
a substrate;
an electrode stack comprising insulating patterns and conductive electrode patterns alternatingly stacked on a surface of the substrate;
vertical channel structures extending through the electrode stack to contact the substrate;
lower insulating patterns between the electrode stack and the surface of the substrate at opposite sides of the electrode stack to define respective recesses adjacent sidewalls of the vertical channel structures; and
data storing patterns continuously extending from between the sidewalls of the vertical channel structures and the electrode stack to the surface of the substrate and into the respective recesses to contact sidewalls of the lower insulating patterns.

17. The three-dimensional semiconductor memory device of claim 16, wherein the data storing patterns respectively comprise vertical portions extending between the sidewalls of the vertical channel structures and the electrode stack, first lateral portions extending into the respective recesses to contact the sidewalls of the lower insulating patterns, and second lateral portions extending along the surface of the substrate to contact adjacent ones of the vertical channel structures.

18. The three-dimensional semiconductor memory device of claim 17, wherein a thickness of the lower insulating patterns is greater than that of the data storing patterns and smaller than that of the conductive electrode patterns, and wherein the first lateral portions of the data storing patterns in the respective recesses have a thickness of about twice that of the vertical portions.

19. The three-dimensional semiconductor memory device of claim 17, further comprising:
a first protection insulating pattern between the first and second lateral portions of the data storing patterns and the surface of the substrate to provide electrical insulation therefrom; and
a second protection insulating pattern between the first and second lateral portions of the data storing patterns and the electrode stack,
wherein the first and second protection insulating patterns comprise an insulating material different from the lower insulating patterns.

20. The three-dimensional semiconductor memory device of claim 16, wherein the vertical channel structures respectively comprise:
a first semiconductor pattern extending along the data storing patterns on sidewalls of the electrode stack, wherein the first semiconductor pattern and the data storing patterns are confined above the surface of the substrate; and
a second semiconductor pattern extending along the sidewalls of the electrode stack with the first semiconductor pattern therebetween, and beyond the data storing patterns to directly contact the substrate below the surface thereof,
wherein the second semiconductor pattern is free of epitaxial semiconductor layers.

* * * * *